(12) United States Patent
Lee et al.

(10) Patent No.: US 12,419,174 B2
(45) Date of Patent: Sep. 16, 2025

(54) ORGANIC LIGHT EMITTING DISPLAY DEVICE

(71) Applicant: LG DISPLAY CO., LTD., Seoul (KR)

(72) Inventors: MinJic Lee, Paju-si (KR); HongSik Kim, Goyang-si (KR); Yeseul Han, Gimpo-si (KR); JeongOk Jo, Seoul (KR); Kwanghyun Choi, Seoul (KR)

(73) Assignee: LG Display Co., Ltd. (KR)

( * ) Notice: Subject to any disclaimer, the term of this patent is extended or adjusted under 35 U.S.C. 154(b) by 835 days.

(21) Appl. No.: 17/541,479

(22) Filed: Dec. 3, 2021

(65) Prior Publication Data

US 2022/0208904 A1 Jun. 30, 2022

(30) Foreign Application Priority Data

Dec. 24, 2020 (KR) ........................ 10-2020-0183783

(51) Int. Cl.
*H10K 59/35* (2023.01)
*H10K 50/844* (2023.01)
*H10K 59/122* (2023.01)
*H10K 59/124* (2023.01)
*H10K 59/80* (2023.01)
(Continued)

(52) U.S. Cl.
CPC ......... *H10K 59/352* (2023.02); *H10K 50/844* (2023.02); *H10K 59/122* (2023.02); *H10K 59/124* (2023.02); *H10K 59/80515* (2023.02); *H10K 59/8731* (2023.02); *H10K 71/00* (2023.02); *H10K 59/1201* (2023.02)

(58) Field of Classification Search
CPC .. H10K 59/122; H10K 50/844; H10K 59/124; H10K 71/00; H10K 59/1201; H10K 59/353; H10K 59/80515; H10K 59/8731; H10K 59/352; H10K 59/131; G09F 9/301
See application file for complete search history.

(56) References Cited

U.S. PATENT DOCUMENTS

2014/0346484 A1* 11/2014 Nendai .............. H10K 59/1315
438/23
2017/0033166 A1* 2/2017 Shim .................. H10K 59/1315

FOREIGN PATENT DOCUMENTS

KR 100714012 B1 5/2007
KR 10-2010-0062556 A 6/2010
(Continued)

OTHER PUBLICATIONS

Notice of Allowance in Korean Appln. No. 10-2020-0183783, mailed on Jun. 27, 2025, 10 pages (with English translation).

*Primary Examiner* — Patricia D Valenzuela
(74) *Attorney, Agent, or Firm* — Fish & Richardson P.C.

(57) ABSTRACT

An organic light emitting display device includes a substrate having a display area including a plurality of sub pixels and a non-display area which encloses the display area, a thin film transistor on the substrate, a planarization layer on the thin film transistor, an anode which is disposed on the planarization layer and is disposed for each sub pixel, a bank layer which is disposed on the planarization layer and includes a first opening unit exposing at least a part of the anode and a second opening unit spaced apart from the first opening unit, a first spacer on the bank layer, and a second spacer which is continuously disposed on the anode and the bank layer so as to overlap with a part of an edge of the first opening unit, and the bank layer has a reverse tapered shape and the second spacer has a tapered shape.

20 Claims, 13 Drawing Sheets

(51) Int. Cl.
*H10K 71/00* (2023.01)
*H10K 59/12* (2023.01)

(56) References Cited

FOREIGN PATENT DOCUMENTS

| | | |
|---|---|---|
| KR | 20170035064 A | 3/2017 |
| KR | 20190063929 A | 6/2019 |

* cited by examiner

ORGANIC LIGHT EMITTING DISPLAY DEVICE

CROSS-REFERENCE TO RELATED APPLICATION

This application claims the priority of Korean Patent Application No. 10-2020-0183783 filed on Dec. 24, 2020, which is hereby incorporated by reference in its entirety.

BACKGROUND

Field of the Disclosure

The present disclosure relates to an organic light emitting display device in which separation and crack of the organic light emitting diode during the folding are suppressed and impact resistance is improved.

Description of the Background

Unlike a liquid crystal display (LCD) device which includes a backlight, an organic light emitting display (OLED) device does not require a separate light source. Therefore, the organic light emitting display device can be manufactured to be light and thin and has process advantages and has a low power consumption due to the low voltage driving. First of all, the organic light emitting display device includes a self-emitting element and includes layers formed of organic thin films so that the flexibility and elasticity are superior to the other display devices and thus it is advantageous to be implemented as a foldable display device.

Generally, an organic light emitting display panel of a foldable display device includes a substrate, an anode, a bank, a light emitting layer, a cathode, and an encapsulation layer. However, when the display device is folded, a strong stress is applied to the encapsulation layer including an inorganic layer so that a crack is easily generated. As described above, when the encapsulation layer is cracked, there is a problem in that the organic light emitting diode such as a cathode or a light emitting layer is also cracked and the light emitting layer is separated from the panel.

SUMMARY

Accordingly, the present disclosure is to provide an organic light emitting display device which suppresses the crack or separation of the encapsulation layer, the organic light emitting layer, the cathode, and the like by reducing a stress applied to the panel during the folding.

The present disclosure is also to provide an organic light emitting display device with an excellent impact resistance of a folding unit.

The present disclosure is also to provide a foldable organic light emitting display device which is capable of improving a problem in that a display luminance of adjacent pixels is affected by a lateral current.

Further, the present disclosure is to provide an organic light emitting display device which displays images having a higher quality, by suppressing foreign materials generated during a process of forming a light emitting layer using a mask while suppressing the crack and the separation of the encapsulation layer, the organic light emitting layer, the cathode, and the like during the folding.

The present disclosure is not limited to the above-mentioned features, which are not mentioned above, can be clearly understood by those skilled in the art from the following descriptions.

According to an aspect of the present disclosure, an organic light emitting display device includes: a substrate including a display area including a plurality of sub pixels and a non-display area which encloses the display area; a thin film transistor on the substrate; a planarization layer on the thin film transistor; an anode which is disposed on the planarization layer and is disposed for each sub pixel; a bank layer which is disposed on the planarization layer and includes a first opening unit which exposes at least a part of the anode and a second opening unit spaced apart from the first opening unit; a first spacer disposed on the bank layer; and a second spacer which is continuously disposed on the anode and the bank layer so as to overlap a part of an edge of the first opening unit, and the bank layer has a reverse tapered shape and the second spacer has a tapered shape. The opening unit is formed so that the bank layer has a reverse tapered shape and a tapered-shaped spacer which overlaps the opening unit is formed to suppress the separation and the crack at the time of the folding and improve impact resistance.

Other detailed matters of the exemplary aspects are included in the detailed description and the drawings.

According to the present disclosure, the crack or separation of the organic light emitting diode may be suppressed by reducing the stress applied to the display panel during the folding.

According to the present disclosure, the impact resistance of the folding unit may be significantly improved.

According to the present disclosure, a problem in that adjacent sub pixels are affected by a lateral current may be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
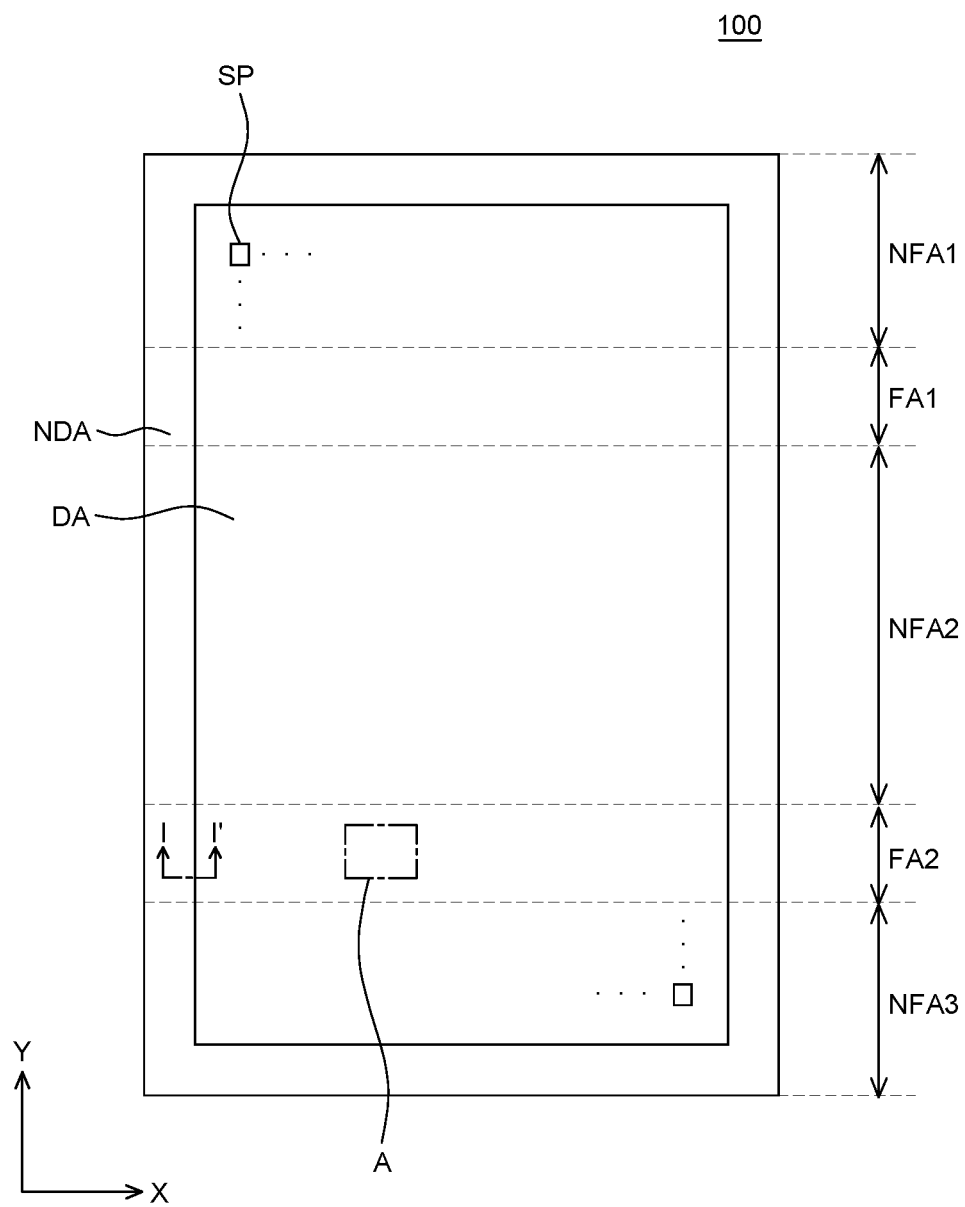
FIG. 1 is a schematic plan view of an organic light emitting display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to exemplary aspects disclosed herein but will be implemented in various forms. The exemplary aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals indicate like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals indicate like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely bonded to or combined with each other and can be interlocked and operated in technically various ways, and the aspects can be carried out independently of or in association with each other.

Hereinafter, the present disclosure will be described in detail with reference to the drawings.

Figure 2:
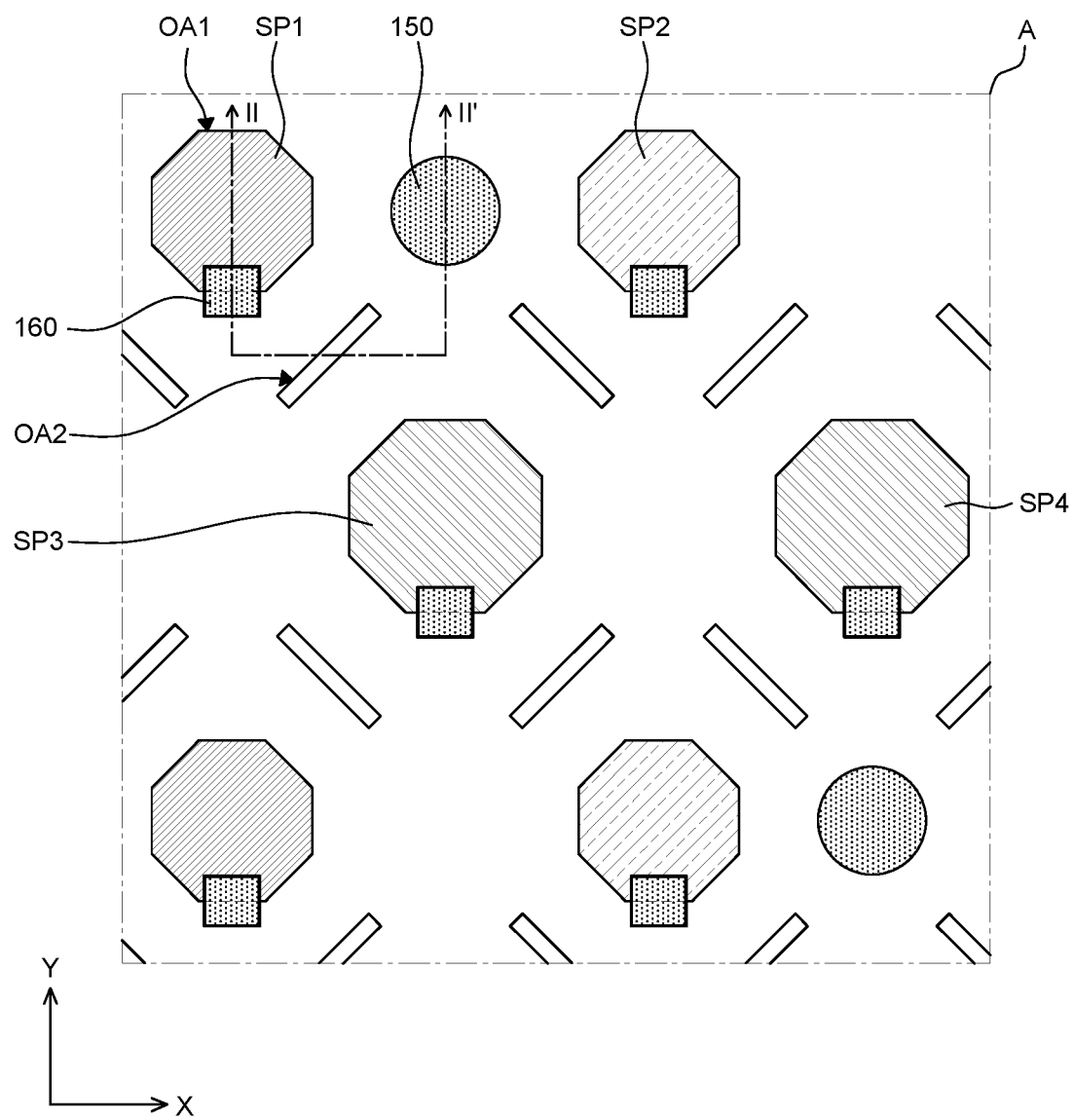
FIG. 2 is an enlarged plan view of area A of FIG. 1.
Figure 3:
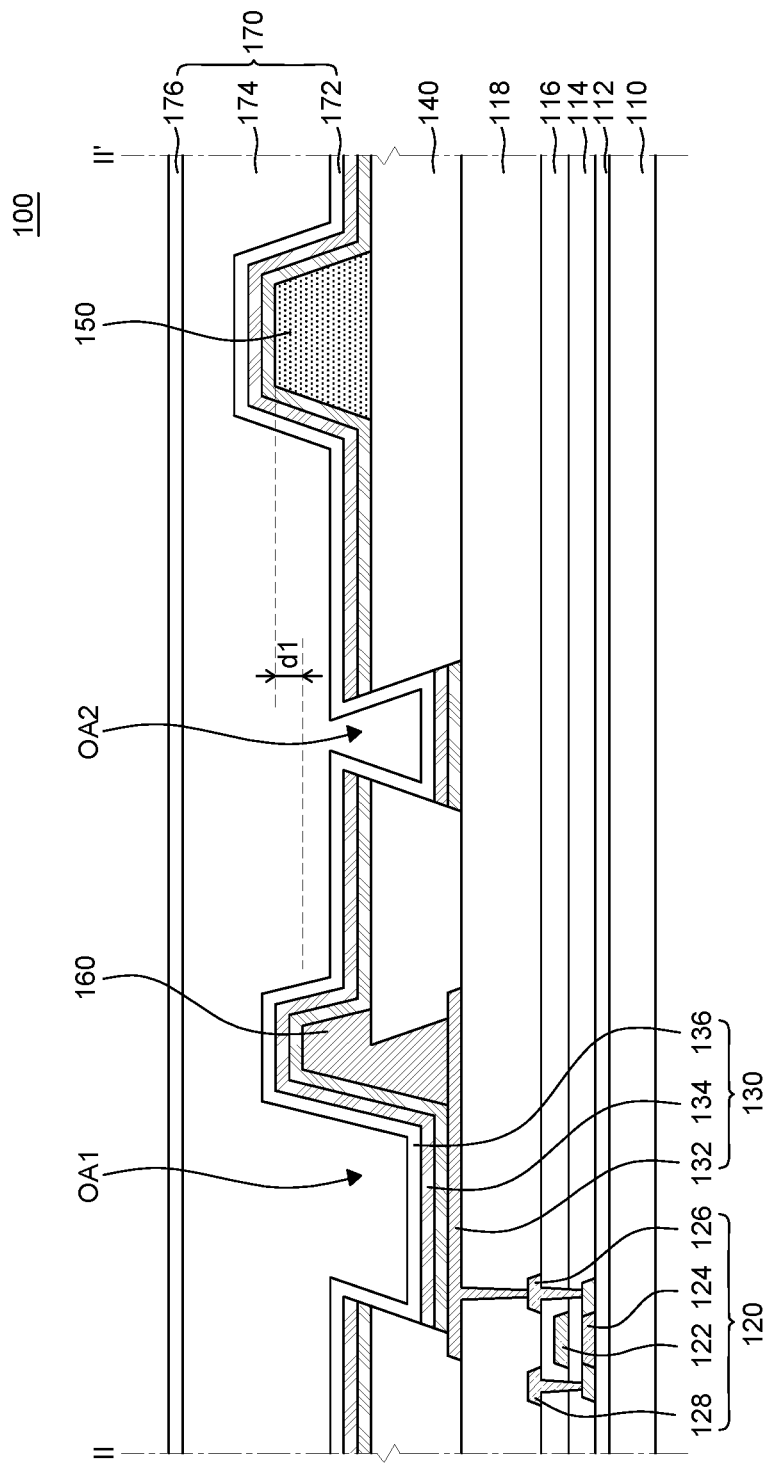
FIG. 3 is a cross-sectional view taken along line of FIG. 2.
Figure 4:
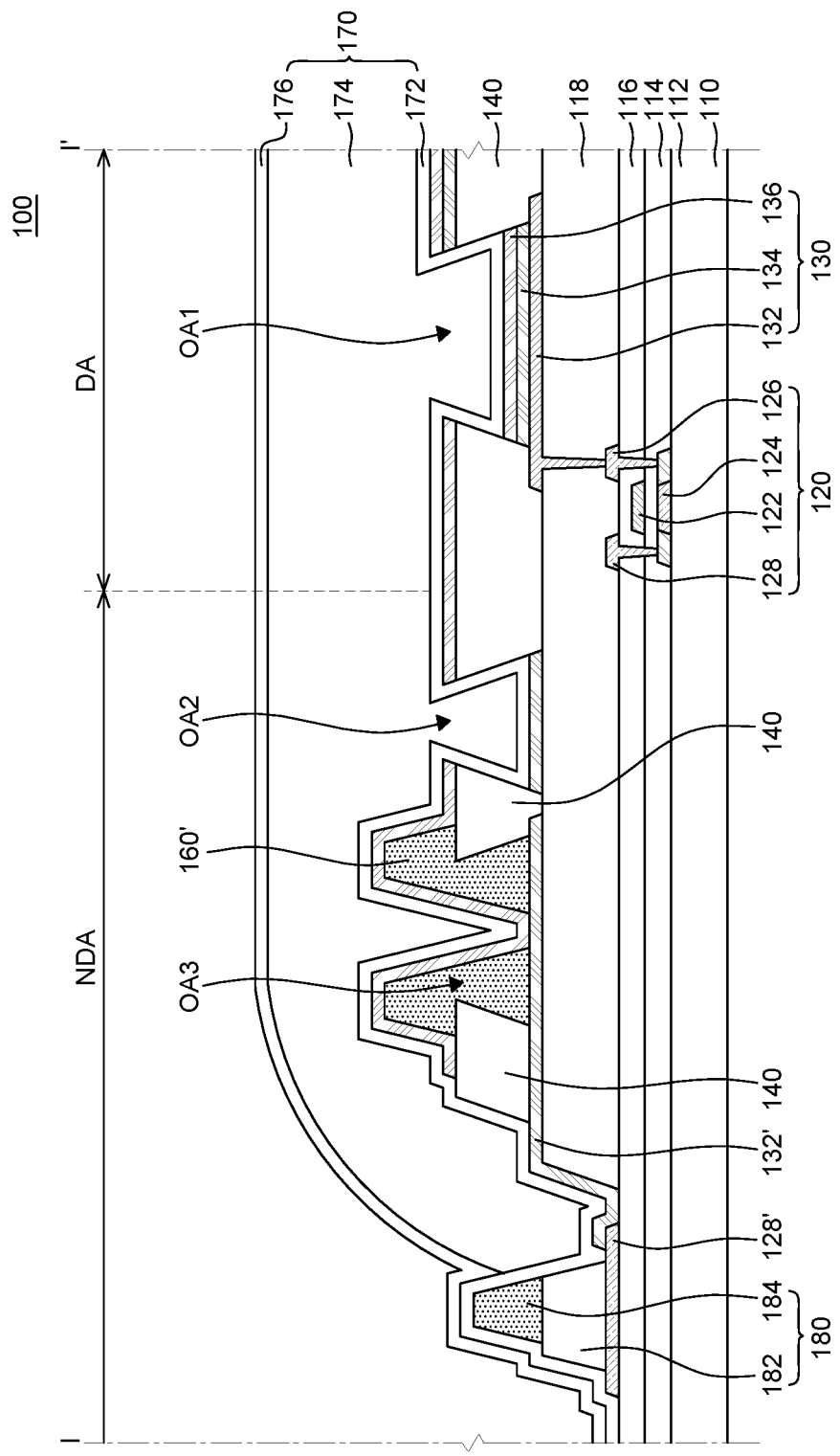
FIG. 4 is a cross-sectional view taken along line I-I' of FIG. 1.

FIGS. 1 to 4 are views for explaining an organic light emitting display device according to an exemplary aspect of the present disclosure. FIG. 1 is a schematic plan view of an organic light emitting display device according to an exemplary aspect of the present disclosure. FIG. 2 is an enlarged plan view of an area A of FIG. 1. FIG. 3 is a cross-sectional view taken along the line II-II' of FIG. 2. FIG. 4 is a cross-sectional view taken along the line I-I' of FIG. 1.

Referring to FIGS. 1 to 4, an organic light emitting display device 100 according to an exemplary aspect of the present disclosure includes a flexible substrate 110, a thin film transistor 120, an organic light emitting diode 130, a bank layer 140, a first spacer 150, a second spacer 160, a third spacer 160', an encapsulation layer 170, and a dam structure 180.

Referring to FIG. 1, the organic light emitting display device 100 according to the exemplary aspect of the present disclosure includes a display area DA and a non-display area NDA. The display area DA is an area where a plurality of sub pixels SP is disposed to substantially display images. In the display area DA, a plurality of sub pixels SP including an emission area for displaying images and a driving circuit for driving the sub pixels SP may be disposed. A sub pixel SP is an element which displays one color and includes an emission area where light is emitted and a non-emission area where light is not emitted, but in the specification, only the emission area where the light is emitted is defined as a sub pixel. The plurality of sub pixels SP is disposed in a matrix shape. The non-display area NDA encloses the display area DA. The non-display area NDA is an area where images are not substantially displayed and various wiring lines, driving ICs, printed circuit boards, and the like for driving the pixels and the driving circuits disposed in the display area DA are disposed. For example, in the non-display area NDA, various driving ICs such as a gate driver IC and a data driver IC and VSS lines may be disposed.

The plurality of sub pixels SP is disposed in a matrix shape. The plurality of sub pixels SP may configure one pixel unit. For example, referring to FIG. 2, one pixel unit may include a first sub pixel SP1, a second sub pixel SP2, a third sub pixel SP3, and a fourth sub pixel SP4. The first sub pixel SP1 and the second sub pixel SP2 are alternately disposed in a first direction (an x-axis direction) and the third sub pixel SP3 and the fourth sub pixel SP4 are alternately disposed along the first direction (the x-axis direction) to be spaced apart from the first sub pixel SP1 and the second sub pixel SP2 in a second direction (a y-axis direction), but are not limited thereto.

The first sub pixel SP1, the second sub pixel SP2, the third sub pixel SP3, and the fourth sub pixel SP4 may display different colors and some sub pixels may display the same color as needed. Each of the first sub pixel SP1, the second sub pixel SP2, the third sub pixel SP3, and the fourth sub pixel SP4 may be any one of a red sub pixel, a green sub pixel, and a blue sub pixel. For example, the sub pixels may be disposed to have a pentile structure in which the first sub pixel SP1 and the second sub pixel SP2 are a red sub pixel and a blue sub pixel, respectively, and both the third sub pixel SP3 and the fourth sub pixel SP4 are green sub pixels. When the plurality of sub pixels SP is disposed with a pentile structure, the number of the first sub pixels SP1 and the second sub pixels SP2 disposed in the display area DA may be reduced as compared with the sub pixels disposed in a stripe structure. As the number of sub pixels SP is reduced, an aperture ratio may be improved while maintaining the same level of cognitive resolution compared to the stripe structure. Further, the number of sub pixels SP is reduced so that a manufacturing process of the organic light emitting display panel is simplified and it is advantageous in terms of the power consumption. Hereinafter, the organic light emitting display device 100 according to the exemplary aspect of the present disclosure will be described under the assumption that the first sub pixel SP1 is a red sub pixel, the second sub pixel SP2 is a blue sub pixel, and the third sub pixel SP3 and the fourth sub pixels SP4 are green sub pixels. However, colors of the sub pixels have been described as an example for the convenience of description so that the present disclosure is not limited thereto.

In FIG. 2, it is illustrated that the plurality of sub pixels SP1, SP2, SP3, and SP4 is formed with a pentile structure, but is not limited thereto. The color and the arrangement of the sub pixels may vary in various forms depending on the necessity. Further, in FIG. 2, it is illustrated that the plurality of sub pixels SP1, SP2, SP3, and SP4 has an octagonal shape, but it is not limited thereto and the shape of the sub pixels may be changed to various shapes. For example, each sub pixel may have a polygonal shape other than a circular shape, an oval shape, or an octagonal shape.

The organic light emitting display device 100 includes at least one folding unit which is foldable and a non-folding unit which is an area other than the folding unit. In FIG. 1, it is illustrated that the folding unit includes a first folding unit FA1 and a second folding area FA2 and the non-folding unit includes a first non-folding unit NFA1, a second non-folding unit NFA2, and the third non-folding unit NF3, but is not limited thereto.

The folding units FA1 and FA2 are areas which are folded when the organic light emitting display device 100 is folded and are folded in accordance with a specific radius of curvature with respect to a folding axis. For example, the folding axis of the folding units FA1 and FA2 may be formed in the X-axis direction and the non-folding units NFA1, NFA2, and NFA3 may extend from the folding units FA1 and FA2 in a Y-axis direction perpendicular to the folding axis. When the folding units FA1 and FA2 are folded with respect to the folding axis, the folding units FA1 and FA2 may form a part of a circle or an oval. At this time, a radius of curvature of the folding units FA1 and FA2 refers to a radius of a circle or an oval formed by the folding units FA1 and FA2.

The non-folding units NFA1, NFA2, and NFA3 are areas which are not folded when the organic light emitting display device 100 is folded. When the organic light emitting display device 100 is folded, the non-folding units NFA1, NFA2, and NFA3 maintain a flat state. The non-folding units NFA1, NFA2, and NFA3 may be located on both sides of the folding units FA1 and FA2. That is, the non-folding units NFA1, NFA2, and NFA3 may be areas extending to the Y-axis direction with respect to the folding axis. At this time, the folding units FA1 and FA2 may be defined between the non-folding units NFA1, NFA2, and NFA3. Further, when the organic light emitting display device 100 is folded with respect to the folding axis, the non-folding units NFA1, NFA2, and NFA3 may overlap each other. For example, the first folding unit FA1 may be defined between the first non-folding unit NFA1 and the second non-folding unit NFA2, and the second folding unit FA2 may be defined between the second non-folding unit NFA2 and the third non-folding unit NFA3.

When a surface of the organic light emitting display device 100 on which images are displayed is defined as a top surface and a rear surface of the organic light emitting display device 100 is defined as a bottom surface, the folding units FA1 and FA2 may be folded by a method selected from an outer-folding method and an inner-folding method. According to the outer-folding method, the folding units are folded to expose the top surface of the organic light emitting display device 100 to the outside, and according to the inner-folding method, the folding units are folded to expose the bottom surface of the organic light emitting display device 100 to the outside.

The substrate supports various components such as the thin film transistor 120 or the organic light emitting diode 130. The substrate may be formed of an insulating material. Further, as illustrated in FIG. 1, when the organic light emitting display device 100 is used as a foldable display device, the substrate may be a flexible substrate which is formed of an insulating material having a flexibility. Hereinafter, it is described that the substrate is a flexible substrate. Specifically, the flexible substrate 110 may be an insulating plastic substrate selected from polyimide, polyethersulfone, polyethylene terephthalate, and polycarbonate. However, it is not limited thereto and if a material is not broken even when the organic light emitting display device 100 is repeatedly folded, not only the plastic, but also a material having a flexibility may be used. The flexible substrate 110 has an excellent flexibility, but is thinner and has a weaker rigidity than the glass substrate so that when various elements are disposed, the flexible substrate may be sagged. Accordingly, a support member such as a back plate may be selectively disposed below the flexible substrate 110 as needed. The back plate supports the flexible substrate 110 so as not to be sagged and protects components disposed on the flexible substrate 110 from moisture, heat, and impact from the outside. The back plate may be a plastic material such as polymethylmethacrylate, polycarbonate, polyvinyl alcohol, acrylonitrile-butadiene-styrene, or polyethylene terephthalate, but is not limited thereto. When the back plate is disposed below the flexible substrate 110, an adhesive layer may be disposed between the flexible substrate 110 and the back plate to attach them. The adhesive layer may use an optical clear adhesive, a pressure-sensitive adhesive, an optical clear resin, or the like, but is not limited thereto.

A buffer layer 112 is disposed on the flexible substrate 110. The buffer layer 112 may enhance an adhesiveness between layers formed on the buffer layer 112 and the flexible substrate 110. Further, the buffer layer 112 blocks alkali components leaked from the flexible substrate 110 and suppresses diffusion of moisture and/or oxygen which permeates from the outside of the flexible substrate 110. The buffer layer 112 may be configured by a single layer or a multi-layer of silicon nitride (SiNx) or silicon oxide SiOx, but is not limited thereto. Further, the buffer layer 112 may be omitted based on a type or a material of the flexible substrate 110 and a structure and a type of the thin film transistor.

A thin film transistor 120 which includes a gate electrode 122, an active layer 124, a source electrode 126, and a drain electrode 128 is disposed on the buffer layer 112. The thin film transistor 120 is disposed in each area of the first sub pixel SP1, the second sub pixel SP2, the third sub pixel SP3, and the fourth sub pixel SP4. In FIG. 3, only a driving thin film transistor, among various thin film transistors which may be included in the organic light emitting display device 100, is illustrated for the convenience of description. Further, it is described that the thin film transistor 120 has a coplanar structure as an example in FIG. 3, but the present disclosure is not limited thereto and a thin film transistor 120 having an inverted staggered structure may also be used.

For example, the active layer 124 is disposed on the buffer layer 112, and a gate insulating layer 114 is disposed on the active layer 124 to insulate the active layer 124 and the gate electrode 122 from each other. Further, an interlayer insulating layer 116 is disposed on the gate insulating layer 114 to insulate the gate electrode 122 from the source electrode 126 and the drain electrode 128. The source electrode 126 and the drain electrode 128 which are in contact with the active layer 124 are disposed on the interlayer insulating layer 116. The gate insulating layer 114 and the interlayer insulating layer 116 may include a contact hole through which the source electrode 126 and the drain electrode 128 are electrically connected to the active layer 124. A planarization layer 118 may be disposed on the thin film transistor 120. The planarization layer 118 planarizes an upper portion of the thin film transistor 120. The planarization layer 118 may include a contact hole which electrically connects the thin film transistor 120 and the anode 132 of the organic light emitting diode 130.

The organic light emitting diode 130 is disposed on the planarization layer 118. The organic light emitting diode 130 includes an anode 132, an organic light emitting layer 134, and a cathode 136.

The anode 132 is disposed on the planarization layer 118. The anode 132 is disposed so as to correspond to the first sub pixel SP1, the second sub pixel SP2, the third sub pixel SP3, and the fourth sub pixel SP4, respectively. The anode 132 is electrically connected to the source electrode 126 of the thin film transistor 120. The anode 132 is formed of a conductive material having a high work function to supply holes to the organic light emitting layer 134. The anode 132 may be a transparent conductive layer which is formed of transparent conductive oxide (TCO). For example, the anode 132 may be formed by one or more selected from transparent conductive oxides such as indium tin oxide (ITO), indium zinc oxide (IZO), indium tin zinc oxide (ITZO), tin oxide (SnO2), zinc oxide (ZnO), indium copper oxide (ICO), and aluminum:zinc oxide (Al:ZnO, AZO), but is not limited thereto. When the organic light emitting display device 100 is driven by a top emission method, the anode 132 may further include a reflection layer which reflects light emitted from the organic light emitting layer 134 toward the cathode 136. The anode 132 may be formed to be separated for each of the first sub pixel SP1, the second sub pixel SP2, the third sub pixel SP3, and the fourth sub pixel SP4.

The bank layer 140 is disposed on the anode 132 and the planarization layer 118. The bank layer 140 may cover an edge of the anode 132 of the organic light emitting diode 130 to define an emission area. As described above, in the present specification, only an emission area in which light is emitted is defined as a sub pixel SP. That is, the bank layer 140 may divide the plurality of sub pixels SP1, SP2, SP3, and SP4. The bank layer 140 may be formed of an insulating material which insulates anodes 132 of adjacent sub pixels SP1, SP2, SP3, and SP4 from each other. Further, the bank layer 140 may be configured by a black bank having a high light absorption rate to suppress color mixture between adjacent sub pixels SP1, SP2, SP3, and SP4. For example, the bank layer 140 may be formed of a polyimide resin, an acrylic resin, or a benzocyclobutene resin, but is not limited thereto. The bank layer 140 will be described in more detail below.

The organic light emitting layer 134 is disposed on the anode 132. The organic light emitting layer 134 is a layer in which electrons and holes are coupled to emit light. Therefore, organic light emitting layers 134 which emit light having corresponding colors may be disposed in the sub pixels SP1, SP2, SP3, and SP4. For example, a red organic light emitting layer is disposed in the first sub pixel SP1, a blue organic light emitting layer is disposed in the second sub pixel SP2, and green organic light emitting layers are disposed in the third sub pixel SP3 and the fourth sub pixel SP4, but it is not limited thereto.

The cathode 136 is disposed on the organic light emitting layer 134. The cathode 136 is not patterned for each of the sub pixels SP1, SP2, SP3, and SP4, but may be formed as one layer to cover the organic light emitting layers 134 and the bank layer 140. That is, the cathode 136 may be formed as a single layer in the first sub pixel SP1, the second sub pixel SP2, the third sub pixel SP3, and the fourth sub pixel SP4.

The cathode 136 may be formed of a metal material having a low work function to smoothly supply electrons to the organic light emitting layer 134. For example, the cathode 136 may be formed of a metal material selected from calcium (Ca), barium (Ba), aluminum (Al), silver (Ag), and alloys including one or more of them, but is not limited thereto. When the organic light emitting display device 100 is driven as a top emission type, the cathode 136 is formed to have a very small thickness to be substantially transparent.

In order to improve luminous efficiency of the organic light emitting diode 130, a hole injection layer, a hole transport layer, an electron transport layer, an electron injection layer, and the like may be further included. For example, the hole injection layer and the hole transport layer may be disposed between the anode 132 and the organic light emitting layer 134 and the electron transport layer and the electron injection layer may be disposed between the organic light emitting layer 134 and the cathode 136. Further, a hole blocking layer or an electron blocking layer may be disposed to further improve a recombination efficiency of the holes and electrons in the organic light emitting layer 134.

The encapsulation layer 170 is disposed on the cathode 136. The encapsulation layer 170 minimizes deterioration of the components of the organic light emitting display device 100 due to the moisture, oxygen, or the like. The encapsulation layer 170 planarizes an upper surface of the organic light emitting diode 130. The encapsulation layer 170 may be formed with a multi-layered structure in which inorganic layers and organic layers are laminated. For example, the encapsulation layer 170 may be configured by at least one organic layer and at least two inorganic layers and have a multi-layered structure in which the inorganic layers and the organic layer are alternately laminated, but is not limited thereto. For example, the encapsulation layer 170 may have a triple-layered structure including a first inorganic encapsulation layer 172, an organic encapsulation layer 174, and a second inorganic encapsulation layer 176. For example, the first inorganic encapsulation layer 172 and the second inorganic encapsulation layer 176 may be independently formed of one or more selected from silicon nitride (SiNx), silicon oxide (SiOx), silicon oxynitride (SiON), and aluminum oxide ($Al_2O_3$), but is not limited thereto. For example, the organic encapsulation layer 174 may be formed of one or more selected from an epoxy resin, polyimide, polyethylene, and silicon oxycarbide (SiOC), but is not limited thereto.

Referring to FIG. 4, a signal line 128' is disposed in a non-display area NDA. The signal line 128' is disposed on the interlayer insulating layer 116 corresponding to the non-display area NDA. The signal line 128' may be disposed on the same plane as the source electrode 126 and the drain electrode 128. The signal line 128' may be a VSS line which supplies a common voltage to the cathode 136 of the organic light emitting diode 130 formed in each sub pixel SP1, SP2, SP3, and SP4. The signal line 128' may be formed of the same material as the source electrode 126 and the drain electrode 128 by the same process, but is not limited thereto.

The signal line 128' is electrically connected to the connection electrode 132'. The connection electrode 132' is disposed on the planarization layer 118 and extends along an outermost periphery of the planarization layer 118 to be in contact with the signal line 128'. The connection electrode 132' may be electrically connected to the cathode 136 by means of a space in which a part of the bank layer 140 which covers the connection electrode 132' is removed. The connection electrode 132' may be formed of the same material as the anode 132 by the same process, but is not limited thereto.

The dam structure 180 is disposed in the non-display area NDA. The dam structure 180 is disposed on the signal line 128'. The dam structure 180 controls the flow of a polymer so as not to allow the polymer for forming the organic encapsulation layer 174 having a liquidity to invade the pad unit in which the signal line 128' and the like is formed when the organic encapsulation layer 174 is formed. The dam structure 180 may be disposed to enclose the display area DA or disposed in the display area DA. Even though in FIG. 4, one dam structure 180 is illustrated, two or more dam structures may also be disposed. The dam structure 180 may be formed as a plurality of layers using at least one material. For example, the dam structure 180 may be formed of a first layer 182 formed of a material used to form the bank layer 140 and a second layer 184 formed of a material used to form the first spacer 150.

Hereinafter, the bank layer 140, the first spacer 150, the second spacer 160, and the third spacer 160' will be described in more detail with reference to FIGS. 2 to 4.

As described above, the bank layer 140 is disposed on the planarization layer 118 so as to cover the edge of the anode 132 to expose the anode 132. At this time, referring to FIGS. 2 and 3, the bank layer 140 includes a first opening unit OA1 formed in the emission area of the display area DA, a second opening unit OA2 formed in the non-emission area, and a third opening unit OA3 formed in the non-display area NDA.

The first opening unit OA1 is formed to correspond to each sub pixel SP1, SP2, SP3, and SP4 and define an emission area of each sub pixel SP1, SP2, SP3, and SP4. That is, the first opening unit OA1 exposes a part of the top surface of the anode 132 corresponding to the emission area. The first opening unit OA1 defines the emission area of each sub pixel SP1, SP2, SP3, and SP4 so that a plurality of first opening units is provided.

Even though in FIG. 2, it is illustrated that the first opening unit OA1 has an octagonal shape, the first opening unit OA1 may have a polygonal shape other than a circle, an oval, or an octagon, it is not limited thereto. Further, even though in FIG. 2, it is illustrated that the first opening units OA1 have the same shape, the first opening units may have different shapes for each of the sub pixels. Further, the first opening units OA1 may have different sizes for each of the sub pixels. For example, as illustrated in FIG. 2, sizes of the first opening units OA1 corresponding to the first sub pixel SP1 and the second sub pixel SP2 are the same and sizes of the first opening units OA1 corresponding to the third sub pixel SP3 and the fourth sub pixel SP4 are the same. However, the sizes of the first opening units OA1 corresponding to the first sub pixel SP1 and the second sub pixel SP2 and the sizes of the first opening units OA1 corresponding to the third sub pixel SP3 and the fourth sub pixel SP4 may be different. However, the size of the first opening units OA1 is not limited thereto, but all the first opening units may have the same size.

The second opening unit OA2 is formed in the non-emission area. Even though in FIG. 3, it is illustrated that the second opening unit OA2 is formed to expose the planarization layer 118 in the non-emission area, it is not limited thereto. For example, the second opening unit OA2 may be a groove which does not expose the planarization layer 118 disposed therebelow but is recessed toward the planarization layer 118 from a top surface of the bank layer 140.

The second opening unit OA2 is disposed between adjacent sub pixels and a plurality of second opening units may be provided. Referring to FIG. 2, the plurality of second openings OA2 is disposed between the first sub pixel SP1 and the third sub pixel SP3, between the second sub pixel SP2 and the third sub pixel SP3, and between the second sub pixel SP2 and the fourth sub pixel SP4. That is, four second openings OA2 are disposed to be adjacent to each other with respect to one sub pixel.

Even though in FIG. 2, it is illustrated that the second opening unit OA2 has a long rectangular shape in a plan view, the second opening unit OA2 may have a polygonal shape other than a circle, an oval, or a quadrangular shape, it is not limited thereto. Further, even though in FIG. 2, it is illustrated that the second opening units OA2 have all the same shape, the second opening units may have different shapes depending on the position.

The third opening unit OA3 is formed in the non-display area NDA disposed on both sides of the display area DA. Referring to FIG. 4, the third opening unit OA3 may expose at least a part of the connection electrode 132' of the non-display area NDA. In the third opening unit OA3, the connection electrode 132' and the cathode 136 are connected.

The bank layer 140 has a reverse tapered shape. Referring to FIGS. 3 and 4, the reverse tapered shape refers to a shape that a width of the bank layer 140 is increased as it gradually moves upwardly from the flexible substrate 110 with respect to the flexible substrate 110. In other words, the bank layer 140 may have a reverse tapered shape from the planarization layer 118 in the first opening unit OA1, the second opening unit OA2, and the third opening unit OA3.

As the bank layer 140 has a reverse tapered shape, the organic light emitting diode 130 is not deposited on a side surface of the bank layer 140 which is exposed by the first opening unit OA1, the second opening unit OA2, and the third opening unit OA3 so that continuity is disconnected. In FIG. 3, it is illustrated that in the first opening unit OA1 and the second opening unit OA2, the organic light emitting layer 134 and the cathode 136 which configure the organic light emitting diode 130 are not disposed to be in contact with the side surface of the bank layer 140, but is disposed on the top surface of the anode 132 or the top surface of the planarization layer 118. However, a continuity of only the organic light emitting layer 134 may be broken on the exposed side surface of the bank layer 140 or a continuity of only the cathode 136 may be broken on the exposed side surface of the bank layer 140.

In the meantime, the encapsulation layer 170 is formed above the organic light emitting diode 130 to be bonded onto the exposed side surface of the bank layer 140 to fix the organic light emitting diode 130. Specifically, a first inorganic encapsulation layer 172 of the encapsulation layer 170 extends along an upper portion of the cathode 136 to be deposited so as to be in direct contact with the side surface of the bank layer 140 exposed by the first opening unit OA1 and the second opening unit OA2. By doing this, when the organic light emitting display device 100 is folded, the separation of the organic light emitting diode 130 disposed in the folding units FA1 and FA2 may be suppressed and the adhesiveness may be improved.

In the meantime, the second opening unit OA2 may reduce a lateral current between adjacent sub pixels. Specifically, holes or electrons move in a horizontal direction by means of an organic layer which configures the organic light emitting diode 130, for example, the hole transport layer or the electron transport layer to generate a current, which is a lateral current. When the lateral current passes through the bank layer to flow to the emission area of the other adjacent sub pixel, it may affect the intensity of light emitted from the organic light emitting layer 134 of the other adjacent sub pixel. This affects the luminance of the adjacent sub pixels, which may degrade a display quality of the organic light emitting display device.

As the bank layer 140 has a reverse tapered shape, the organic light emitting diode 130 is not deposited on a side surface of the bank layer 140 which is exposed by the second opening unit OA2 so that continuity is broken. Therefore, the second opening unit OA2 is formed between the sub pixels to increase a path of the lateral current which moves from one sub pixel to the other adjacent sub pixel. By doing this, a current which is applied to the other adjacent sub pixel due to the lateral current may be suppressed.

The bank layer 140 may be formed of an insulating material which insulates anodes 132 of adjacent sub pixels SP1, SP2, SP3, and SP4 from each other. Further, the bank layer 140 may be configured by a black bank having a high light absorption rate to suppress color mixture between adjacent sub pixels SP1, SP2, SP3, and SP4. For example, the bank layer 140 may be formed of a polyimide resin, an acrylic resin, or a benzocyclobutene resin, but is not limited thereto. The bank layer 140 may be formed of photoresist to have a reverse tapered shape. The photoresist which configures the bank layer 140 will be described below together with the manufacturing method.

The first spacer 150 is disposed on the bank layer 140. When the organic light emitting layer 134 is formed in the plurality of sub pixels SP, a fine metal mask FMM which is a deposition mask may be used. At this time, a plurality of first spacers 150 may be disposed between the plurality of sub pixels SP to support the deposition mask and maintain a predetermined distance with the deposition mask. The first spacer 150 may allow the deposition mask and the bank layer 140 and the anode 132 below the first spacer 150 to maintain a predetermined distance from the deposition mask and suppress the damage due to the contact. At this time, the first spacer 150 may be formed to have a shape which becomes narrower toward the upper portion, for example, a tapered shape, to minimize an area which is in contact with the deposition mask. In the meantime, in FIG. 2, it is illustrated that the first spacer 150 has a circular shape in a plan view, but it is not limited thereto.

A second spacer 160 is disposed to overlap an edge of the first opening unit OA1. As described above, the first opening unit OA1 defines the emission area of each sub pixel SP. Referring to FIG. 2, the second spacer 160 is disposed to overlap a part of the edge of the emission area of each sub pixel SP. That is, the second spacer 160 is disposed to overlap a partial area of a boundary of the emission area and the non-emission area. At this time, the second spacer 160 is disposed to cover a part of the edge of the first opening unit OA1. Referring to FIG. 2, the second spacer 160 is disposed on the anode 132 and the bank layer 140 to overlap a part of the edge of the emission area defined by the first opening unit OA1. Specifically, referring to FIG. 3, the second spacer 160 is disposed to be in continuously contact with a part of a top surface of the anode 132 disposed in the first opening unit OA1, a part of a side surface of the bank layer 140 exposed by the first opening unit OA1, and a part of the top surface of the bank layer 140 adjacent to the first opening unit OA1.

The second spacer 160 allows the cathode 136 to maintain the continuity without being disconnected in the first opening unit OA1. As described above, the bank layer 140 has a reverse tapered shape to suppress the separation of the organic light emitting diode 130 disposed in the folding units FA1 and FA2 and improve the adhesiveness. However, when the bank layer 140 has a reverse tapered shape, the organic light emitting layer 134 and the cathode 136 are not deposited due to the side surface of the bank layer 140 which is exposed during the process of depositing the organic light emitting layer 134 and the cathode 136 after forming the bank layer 140. Therefore, the continuity is broken. By doing this, the electrons may not be supplied to the organic light emitting diode 130 through the cathode 136 so that the organic light emitting diode 130 does not emit light. Accordingly, in order to apply electrons to the cathode 136 in the emission area, the second spacer 160 has a tapered shape so that the cathode 136 is not completely disconnected in the first opening unit OA1. The second spacer 160 may serve as a path so that the cathode 136 which is disconnected due to the reverse tapered shape of the bank layer 140 in the first opening unit OA1 is connected to the top surface of the bank layer 140. That is, the second spacer 160 has a tapered shape so that the organic light emitting layer 134 and the cathode 136 which are disconnected due to the reverse tapered shaped bank layer 140 may be disposed while maintaining the continuity without being disconnected along the top surface of the anode 132, the side surface and the top surface of the second spacer 160, and the top surface of the bank layer 140.

In FIG. 2, it is illustrated that the second spacer 160 has a quadrangular shape, the second spacer 160 may have a circular shape, an oval shape, or other polygonal shapes, but it is not limited thereto. Further, even though in FIG. 2, it is illustrated that all the second spacers 160 have the same shape, the second spacers may have a different shape for each of the sub pixels. Further, even though in FIG. 2, it is illustrated that the second spacer 160 has a different shape from the first spacer 150, the second spacer 160 may have the same shape and the same size as the first spacer 150.

The second spacer 160 disposed in each sub pixel is disposed to overlap an edge of the corresponding first opening unit OA1. At this time, all the second spacers 160 disposed in the sub pixels SP1, SP2, SP3, and SP4 may be disposed to be located in the same direction. Specifically, referring to FIG. 2, all the second spacer 160 disposed in the first sub pixel SP1, the second spacer 160 disposed in the second sub pixel SP2, the second spacer 160 disposed in the third sub pixel SP3, and the second spacer 160 disposed in the fourth sub pixel SP4 are disposed to overlap a lower edge among edges of the first opening unit OA1. That is, the second spacers 160 are disposed in the same position among the edges of the first opening unit OA1 which divides the emission areas of the sub pixels SP1, SP2, SP3, and SP4, respectively. When all the second spacers 160 disposed in the sub pixels SP1, SP2, SP3, and SP4 are disposed to be located in the same direction, a variation of the aperture rate of each of the sub pixels SP1, SP2, SP3, and SP4 by the second spacers 160 may be minimized and the lateral current path may be maintained to be constant and long.

A third spacer 160' is disposed to cover at least a part of the edge of the third opening unit OA3 of the non-display area NDA. Referring to FIG. 4, the third spacer 160' is disposed on the connection electrode 132' and the bank layer 140 so as to overlap a part of the edge of the third opening unit OA3. The third spacer 160' is disposed to be in continuous contact with a part of a top surface of the connection electrode 132' disposed in the third opening unit OA3, a part of a side surface of the bank layer 140 exposed by the third opening unit OA3, and the top surface of the bank layer 140 adjacent to the third opening unit OA3.

The third spacer 160' allows the cathode 136 to maintain a continuity in the third opening unit OA3 without being disconnected to be in direct contact with the connection electrode 132'. As described above for the second spacer 160, the continuity of the cathode 136 is broken by the side surface of the bank layer 140 exposed by the third opening unit OA3. Therefore, the third spacer 160' has the tapered shape like the second spacer 160, so that the cathode 136 is in contact with the connection electrode 132' in the third opening unit OA3 without being disconnected. The third spacer 160' has a tapered shape so that the cathode 136 which is disconnected due to the reverse tapered-shaped bank layer 140 may be disposed while maintaining the continuity without being disconnected along the top surface of the connection electrode 132', the side surface and the top surface of the third spacer 160', and the top surface of the bank layer 140.

Even though in FIG. 4, it is illustrated that the third spacer 160' overlaps two edges of the third opening unit OA3, the third spacer 160' may be disposed to overlap one edge of the third opening unit OA3. That is, if the top surface of the connection electrode 132' is exposed to the outside so that the connection electrode 132' and the cathode 136 are in contact with each other in the third opening unit OA3, a shape of the third spacer 160' is not limited.

Further, the third spacer 160' may have a circular shape, an oval shape, or the other polygonal shape, but is not limited thereto. Further, the third spacer 160' may have the same shape and the same size as the first spacer 150 and the second spacer 160, but is not limited thereto.

The first spacer 150, the second spacer 160, and the third spacer 160' may be formed of a transparent organic insulating material. For example, the first spacer 150, the second spacer 160, and the third spacer 160' may be formed by one of polyimide, photo acryl, an epoxy-based resin, a siloxane-based resin, and benzocyclobutene (BCB). The first spacer 150, the second spacer 160, and the third spacer 160' may be simultaneously formed by a photolithographic process after forming the first opening unit OA1, the second opening unit OA2, and the third opening unit OA3 in the bank layer 140. Therefore, the first spacer 150, the second spacer 160, and the third spacer 160' may be formed of the same material and heights of the first spacer 150, the second spacer 160, and the third spacer 160' may be equal to each other. A method of forming the first spacer 150, the second spacer 160, and the third spacer 160' using a photolithographic process will be described below.

The first spacer 150 is disposed on the bank layer 140, the second spacer 160 and the third spacer 160' may be disposed such that a part thereof is located on the bank layer 140 from the inside of the first opening unit OA1 and the third opening unit OA3. Even though the first spacer 150, the second spacer 160, and the third spacer 160' are formed to have the same height, a height to the top surface of the first spacer 150 is larger than a height to the top surface of the second spacer 160 or the top surface of the third spacer 160'. Specifically, referring to FIG. 3, a difference dl between a height to the top surface of the first spacer 150 and a height to the top surface of the second spacer 160 may be 1.0 µm to 3.0 µm. When the difference dl between a height to the top surface of the first spacer 150 and a height to the top surface of the second spacer 160 is less than 1.0 µm, the first spacer 150 may not support the mask. Further, a part of the mask is in contact with the top surface of the second spacer 160 during the process of forming the organic light emitting layer 134, which may cause foreign materials. Further, when the difference dl between a height to the top surface of the first spacer 150 and a height to the top surface of the second spacer 160 exceeds 3.0 µm, a total thickness of the display panel is increased to deteriorate the folding characteristic of the organic light emitting display device.

When the organic light emitting display device 100 is folded, a tensile stress and a compressive stress may be applied to the display device due to the folding. At this time, the tensile stress and the compressive stress are consistently applied in accordance with the repeated folding so that a separation phenomenon that a plurality of layers which configures the display device is separated from each other is caused, which may cause a defect of the display device. Specifically, among the layers which configure the organic light emitting display device 100 used for the foldable display device, it is difficult for the organic light emitting diode 130 to be patterned to relieve the folding stress and the organic light emitting diode 130 has a weak adhesiveness, which is vulnerable to the separation.

As described above, in order to solve the problem in that the organic light emitting diode 130 is separated in accordance with the folding, a method of forming a spacer having a reverse tapered shape on the bank layer 140 of the folding area FA1 and FA2 may be considered. When the organic light emitting layer, the cathode, and the encapsulation layer are sequentially deposited on the spacer having a reverse tapered shape, the organic light emitting layer and the cathode are not deposited on a side surface of the spacer so that the continuity is broken. However, the encapsulation layer is deposited on the side surface of the spacer to fix the components of the organic light emitting diode. However, when the spacer having a reverse tapered shape is disposed on the bank layer 140, the impact resistance deteriorates. Specifically, in the reverse tapered shape, the width is increased as it moves upwardly so that a strong impact may be applied to a corner of the top surface of the reverse tapered. Specifically, when the foldable display device is folded, a strong stress is concentrated in the upper corner of the spacer having a reverse tapered shape disposed in the folding units FA1 and FA2 even by a small impact. Therefore, the organic light emitting diode or the inorganic layer which are disposed on the spacer are easily separated even by a small impact.

In the organic light emitting display device 100 according to the exemplary aspect of the present disclosure, the opening unit of the bank layer 140 is formed to have a reverse tapered shape. By doing this, when the organic light emitting display device 100 is folded, the separation of the organic light emitting diode 130 disposed in the folding units FA1 and FA2 may be suppressed. That is, the first inorganic encapsulation layer 172 of the encapsulation layer 170 is directly bonded to the side surface of the bank layer 140 by the bank layer 140 having a reverse tapered shape so that the separation of the organic light emitting diode 130 disposed in the folding units FA1 and FA2 may be suppressed. However, when the bank layer 140 has a reverse tapered shape, the organic light emitting layer 134 and the cathode 136 are not deposited due to the exposed side surface of the bank layer 140 so that the continuity is broken. Therefore, in order to apply electrons to the cathode 136 of the emission area, the second spacer 160 having a tapered shape is disposed to overlap the edge of the opening unit. By doing this, the separation problem of the organic light emitting diode 130 may be solved and an organic light emitting display device having an excellent impact resistance may be provided during the folding.

Figure 5:
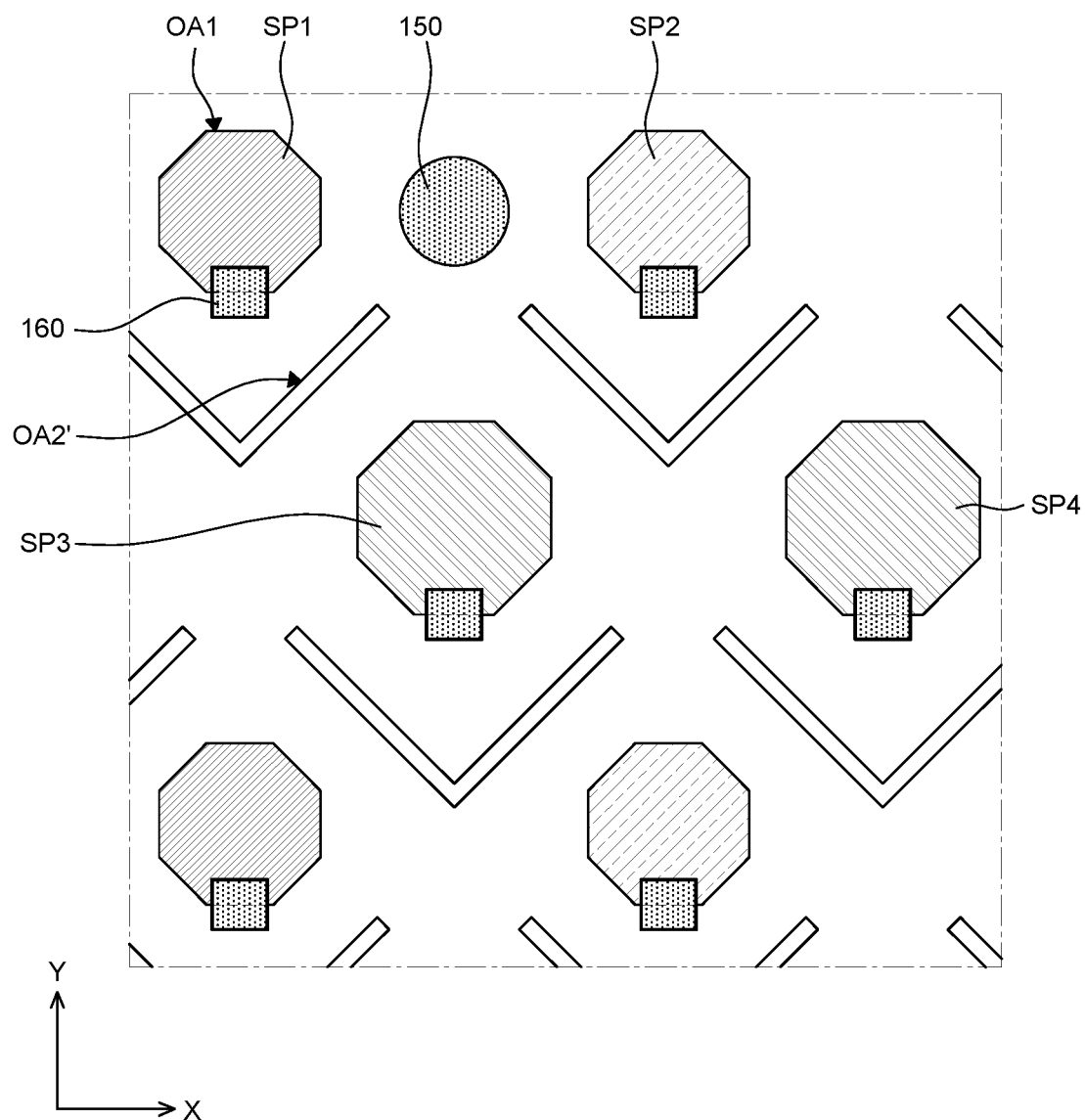
FIG. 5 is an enlarged plan view of an organic light emitting display device according to another exemplary aspect of the present disclosure.

FIG. 5 is an enlarged plan view of an organic light emitting display device according to another exemplary aspect of the present disclosure. Except for a shape of a second opening unit OA2', an organic light emitting display device 200 illustrated in FIG. 5 is substantially the same as the organic light emitting display device 100 illustrated in FIGS. 1 to 4. Therefore, a description of repeated components will be omitted.

Referring to FIG. 5, a plurality of second opening units OA2' is formed. At this time, each second opening unit OA2' is formed to correspond to each of the sub pixels SP1, SP2, SP3, and SP4. At this time, the second opening units OA2' are located in a first direction of the first opening units OA1 of the corresponding sub pixels SP1, SP2, SP3, and SP4, and all the second opening units OA2' are disposed in the same position. In FIG. 5, all the second opening units OA2' are disposed to be located below the first opening units OA1. The second opening unit OA2' is located to be adjacent to the second spacer 160 located at the edge of the first opening unit OA1. Referring to FIG. 5, the second spacer 160 is disposed to overlap a lower edge among the edges of the first opening unit OA1, and the second opening unit OA2' is disposed to be close to the lower edge of the first opening unit OA1 to be adjacent to the second spacer 160.

At this time, the second opening unit OA2' is disposed to enclose a part of the second spacer 160 while being spaced apart from the second spacer 160. Referring to FIG. 5, the second opening unit OA2' has a V shape with a bending portion. At this time, an inner side surface of the second opening unit OA2' which forms an acute angle of the bending portion is disposed to be opposite to the second spacer 160. That is, the inner side surface of the second opening unit OA2' is disposed to enclose the part of the second spacer 160. In the meantime, the shape of the second opening unit OA2' is not limited to a shape having a bending portion which is fixed at a specific angle. That is, as long as the second opening unit OA2' partially encloses the second spacer 160, the second opening unit may be formed without having a limitation. For example, the second opening unit OA2' may have a U shape whose inside faces the second spacer 160.

Unlike the second opening unit OA2 formed in the organic light emitting display device 100 illustrated in FIG. 2, the second opening unit OA2' formed in the organic light emitting display device 200 illustrated in FIG. 5 has a V shape which is spaced apart from the second spacer 160 to partially enclose the second spacer 160. With a structure in which a lower portion of the second opening unit OA2' is connected by means of the bending portion, a distance between the second spacer 160 of one sub pixel and the second spacer 160 of the other sub pixel, which is a path of the lateral current, may be increased. Referring to FIG. 5, the lateral current moving from the first opening unit OA1 of the first sub pixel SP1 through the second spacer 160 needs to move to the third sub pixel SP3 through the second spacer 160 of the third sub pixel SP3 by the second opening unit OA2' having a V shape disposed between the first sub pixel SP1 and the third sub pixel SP3. To this end, the lateral current does not move between the second spacer 160 of the first sub pixel SP1 and the second spacer 160 of the third sub pixel SP3 through a shortest distance, but needs to move by avoiding the second opening unit OA2'. That is, the path of the lateral current between adjacent sub pixels may be increased, which may suppress the problems caused by the lateral current.

Figure 6:
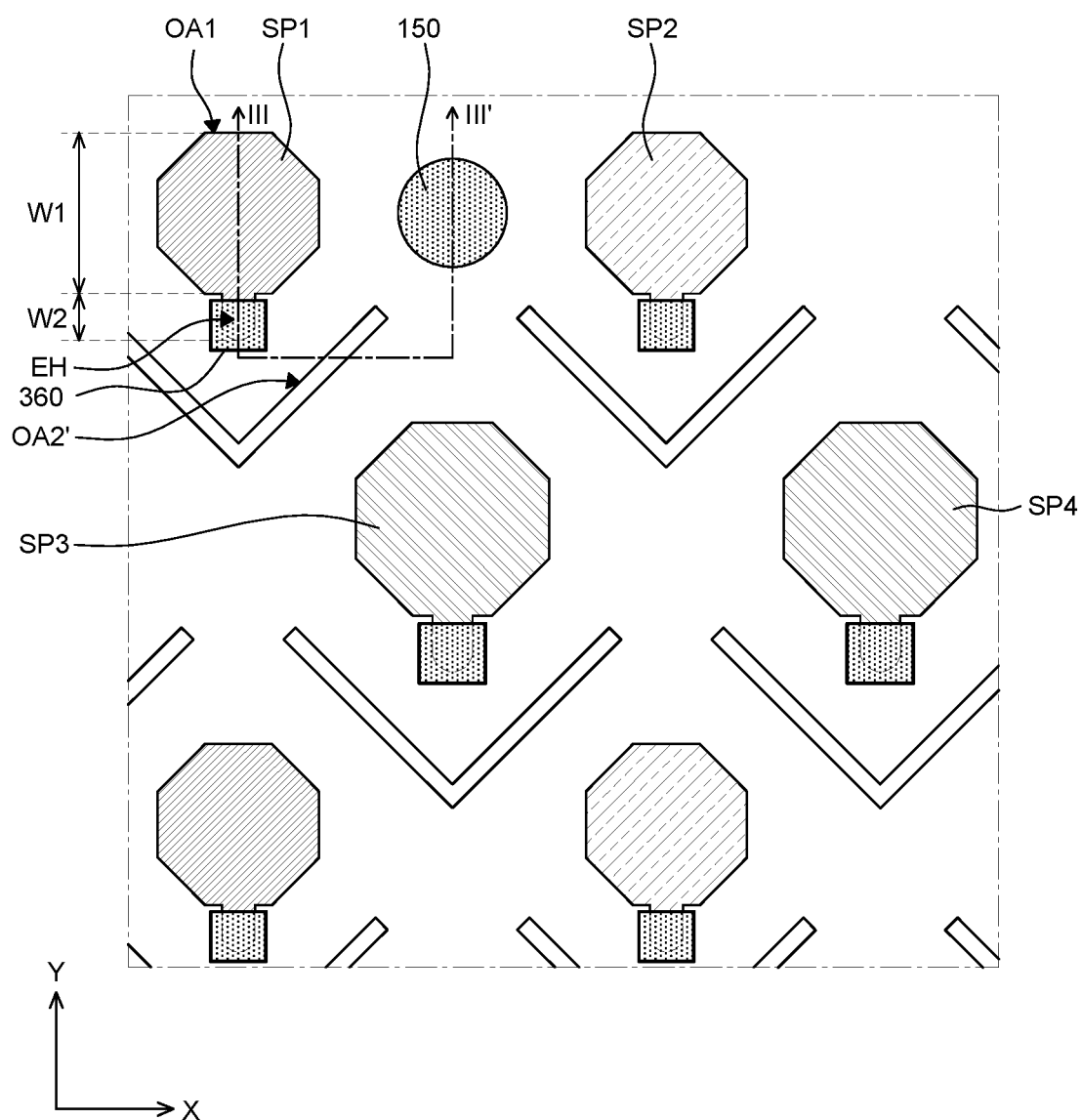
FIG. 6 is an enlarged plan view of an organic light emitting display device according to still another exemplary aspect of the present disclosure.
Figure 7:
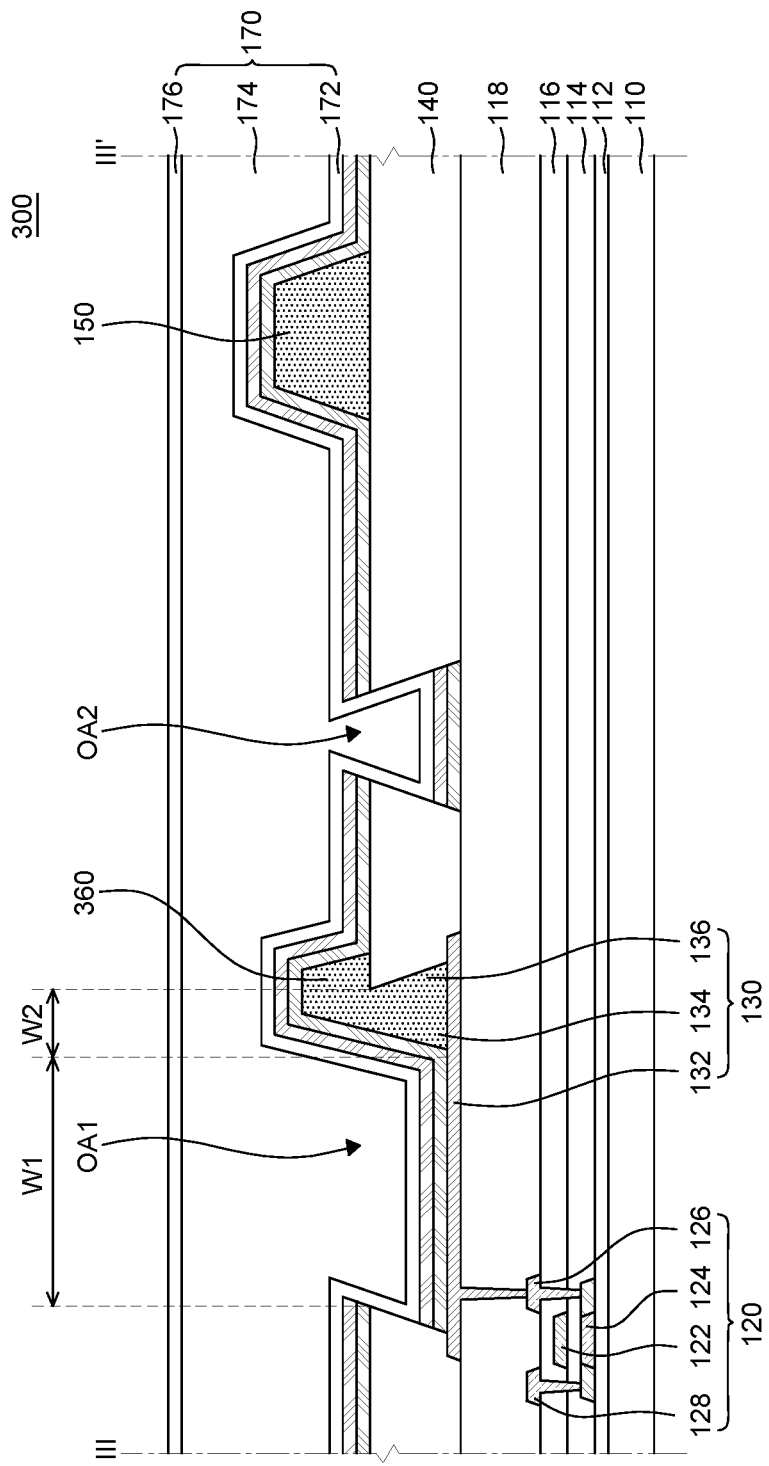
FIG. 7 is a cross-sectional view taken along line of FIG. 6.

FIGS. 6 to 7 are views for explaining an organic light emitting display device according to still another exemplary aspect of the present disclosure. FIG. 6 is an enlarged plan view of an organic light emitting display device according to still another exemplary aspect of the present disclosure. FIG. 7 is a cross-sectional view taken along the line of FIG. 7. An organic light emitting display device 300 illustrated in FIGS. 6 and 7 further includes a groove EH formed to extend from the first opening unit OA1 in one direction and has a different placement structure of the second spacer 360. Except for this, the organic light emitting display device 300 is substantially the same as the organic light emitting display device 200 illustrated in FIG. 5. Therefore, a description of repeated components will be omitted.

In the organic light emitting display device 300 according to still another exemplary aspect of the present disclosure, the first opening unit OA1 further includes a groove EH extending from one edge in one direction. Referring to FIGS. 6 and 7, the groove EH has an opening shape which extends from a lower edge among edges of the first opening unit OA1 having a first width W1 downwardly (to the Y-axis direction) by a second width W2. That is, the groove EH forms an additional opening unit which protrudes from the first opening unit OA1 to the non-emission area by the second width W2.

Even though in FIG. 6, it is illustrated that the groove EH has a polygonal shape including a semicircle, the groove EH may have a circular shape, an oval shape, or various polygonal shapes, but it is not limited thereto.

In the organic light emitting display device 300 according to still another exemplary aspect of the present disclosure, the second spacer 360 is disposed to overlap the groove EH. Similar to the organic light emitting display device 100 illustrated in FIGS. 1 to 4, the second spacer 360 is disposed to overlap a part of the edge of the first opening unit OA1 so that the cathode 136 may maintain the continuity in the first opening unit OA1 without being disconnected. Specifically, referring to FIGS. 6 and 7, the second spacer 360 is disposed to overlap an edge of the groove EH. The second spacer 360 may be disposed to be in continuous contact with a part of a top surface of the anode 132 disposed in the groove EH, a part of a side surface of the bank layer 140 exposed by the groove EH, and a part of a top surface of the bank layer 140 adjacent to the groove EH.

Even though in FIG. 6, it is illustrated that the second spacer 360 has a quadrangular shape, the second spacer 360 may have a circular shape, an oval shape, or other polygonal shapes, but is not limited thereto. Further, an area of the second spacer 360 which overlaps the groove EH is not limited.

The second spacer 360 has a tapered shape so that the organic light emitting layer 134 and the cathode 136 which are disconnected due to the reverse tapered-shaped bank layer 140 may be disposed while maintaining the continuity without being disconnected along the top surface of the anode 132 of the first opening unit OA1, the side surface and the top surface of the second spacer 360 disposed in the groove EH, and the top surface of the bank layer 140.

As compared with the organic light emitting display device 200 illustrated in FIG. 5, the organic light emitting display device 300 illustrated in FIG. 6 further includes a groove EH extending to protrude from the edge of the first opening unit OA1 in the first direction. Therefore, the second spacer 360 may be formed without limiting an area of the emission area defined by the first opening unit OA1.

FIGS. 8A to 8F are schematic cross-sectional views for explaining a manufacturing method of an organic light emitting display device according to an exemplary aspect of the present disclosure.

Figure 8A:
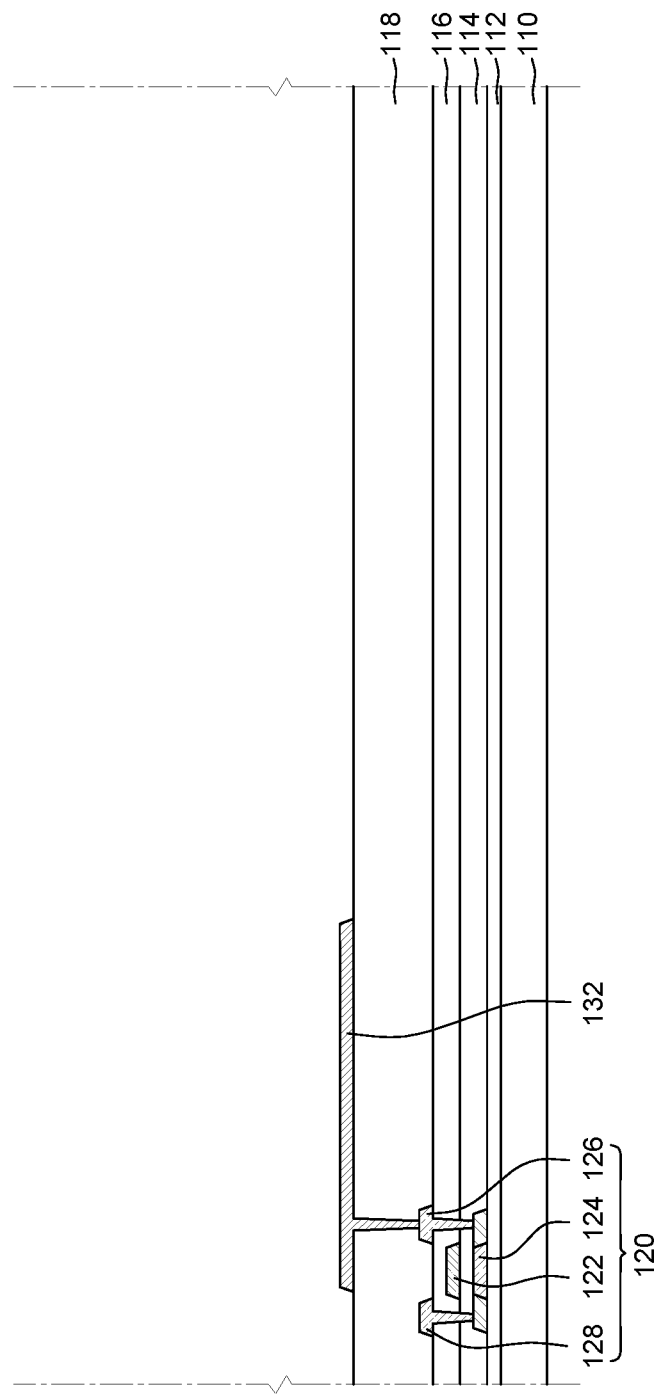
FIGS. 8A to 8F are schematic cross-sectional views for explaining a manufacturing method of an organic light emitting display device according to an exemplary aspect of the present disclosure.

First, referring to FIG. 8A, a thin film transistor 120 is formed on a flexible substrate 110 by means of a plurality of mask processes. Next, an organic insulating material such as photo acryl is entirely applied on the flexible substrate 110 and then a planarization layer 118 including a contact hole is formed by means of a photolithographic process. Next, a first metal layer is entirely deposited on the planarization layer 118 and then a patterned anode 132 is formed by means of the photographic process and an etching process. Even though not illustrated in FIG. 8A, a connection electrode may be formed from the first metal layer in the non-display area NDA by means of subsequent photolithographic process and etching process.

Figure 8B:
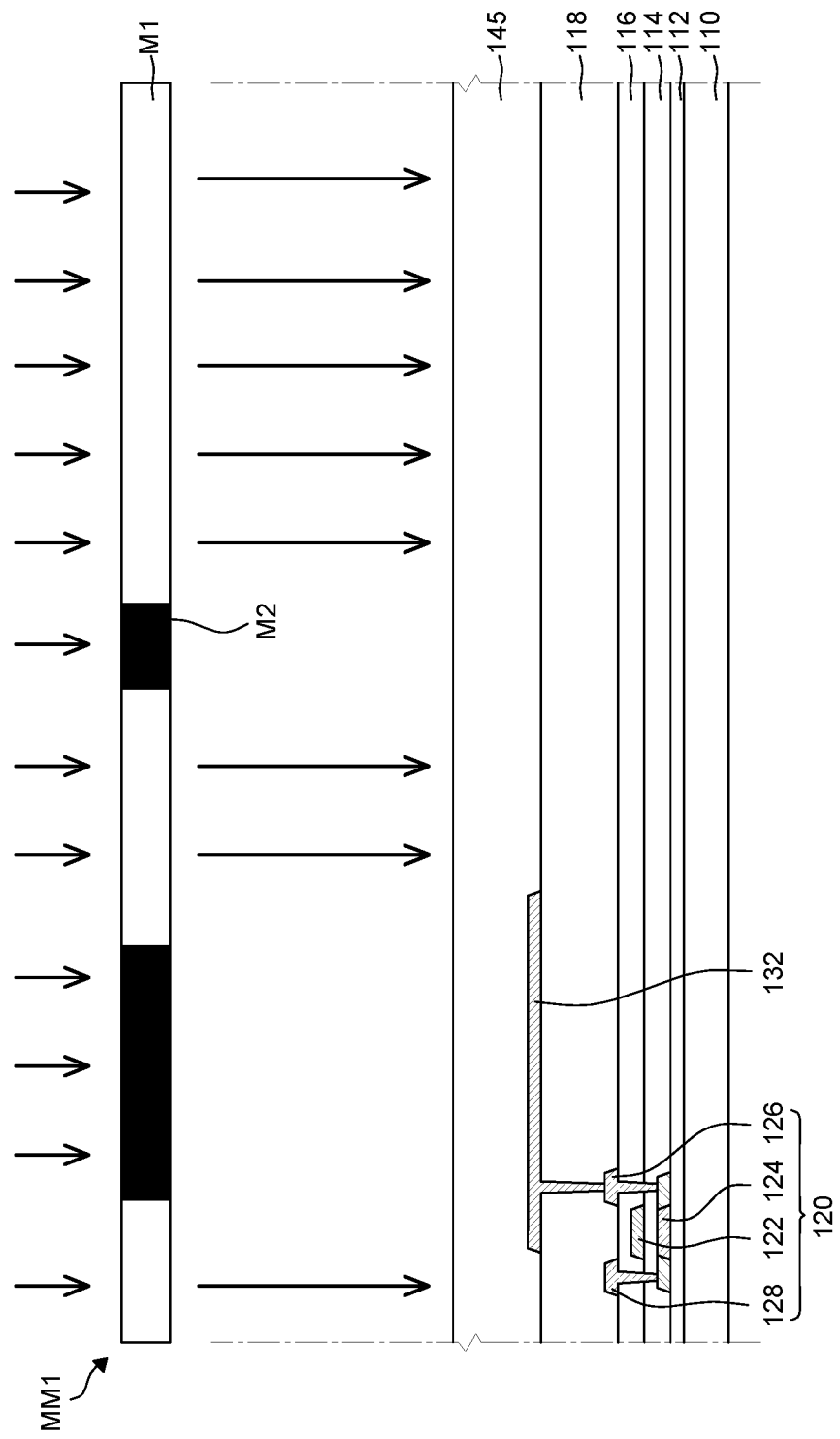

Next, referring to FIG. 8B, a first photoresist layer 145 is formed on the planarization layer 118 on which an anode 132 is formed. The first photoresist layer 145 is formed of a negative photoresist. The negative photoresist is a photoresist whose solubility of the exposed portion in the developer is significantly lowered by the exposure. When the negative photoresist is developed, a pattern from which non-exposed portions are removed is obtained.

As described above, the bank layer 140 may be formed with a material having a high light absorption rate to suppress color mixture between adjacent sub pixels SP. Therefore, the first photoresist layer 145 may further include a black pigment. For example, the black pigment may be selected from carbon black, titanium black TiNxOy, Cu—Mn—Fe-based black pigment, lactam black, perylene black, and aniline black or a red pigment, a blue pigment, and a green pigment are mixed to be used as a black pigment.

After disposing a first mask MM1 on the first photoresist layer 145, an exposure process which is a photolithographic process is performed. The first mask MM1 is configured by a transmissive area M1 and a blocking area M2. The first photoresist layer 145 corresponding to the transmissive area M1 forms a bank layer 140 by means of a subsequent exposure process and the first photoresist layer 145 corresponding to the blocking area M2 is removed by the subsequent exposure process to form an opening unit.

Figure 8C:
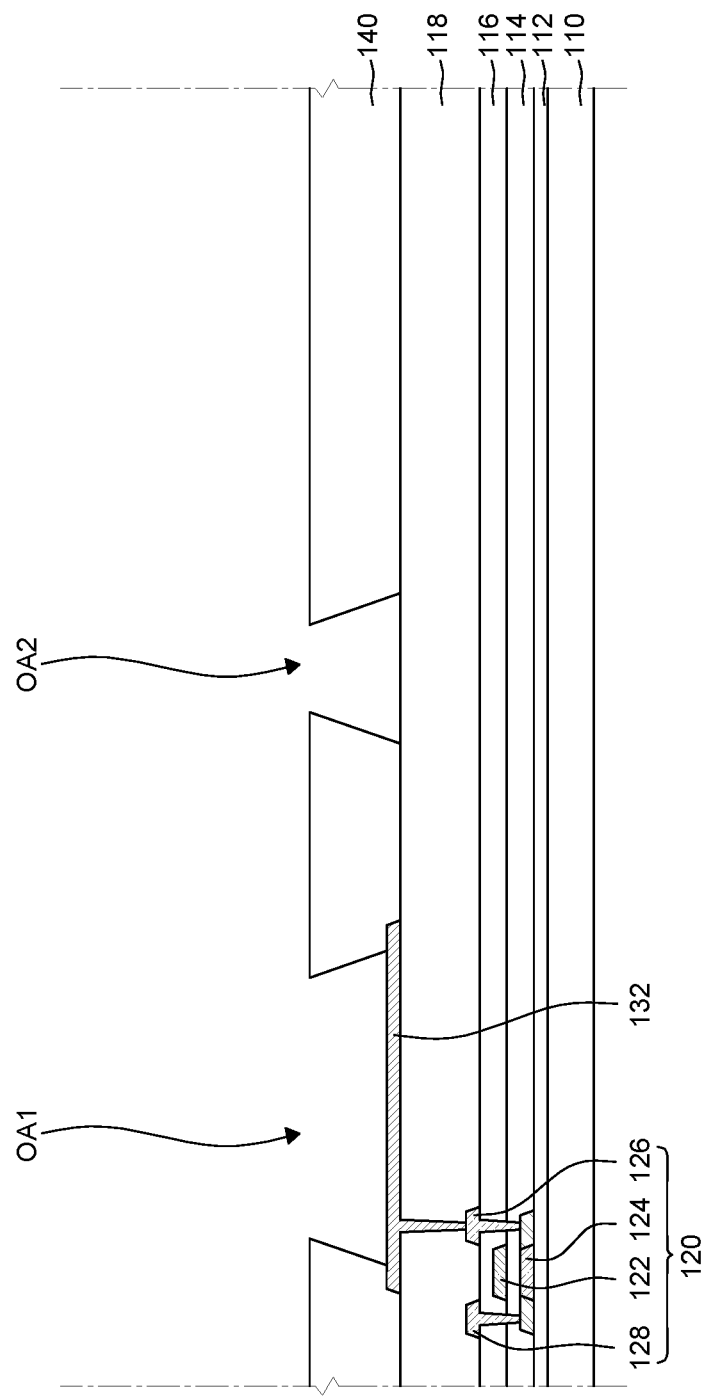

Next, referring to FIG. 8C, the first photoresist layer 145 which has undergone the exposure process is reacted with a developer to remove the first photoresist layer 145 of a light-shielded area. Next, a baking process which is a heating process is performed to form the first opening unit OA1 and the second opening unit OA2 on the first photoresist layer 145 corresponding to the blocking area M2 in the exposure process, and the bank layer 140 having the reverse tapered shape is formed on the first photoresist layer 145 corresponding to the transmissive area M1. The top surface of the anode 132 is exposed by means of the first opening unit OA1 and the planarization layer 118 is exposed by means of the second opening unit OA2. Even though not illustrated in FIG. 8C, a third opening unit is formed in the non-display area and the connection electrode may be exposed through the third opening unit.

Figure 8D:
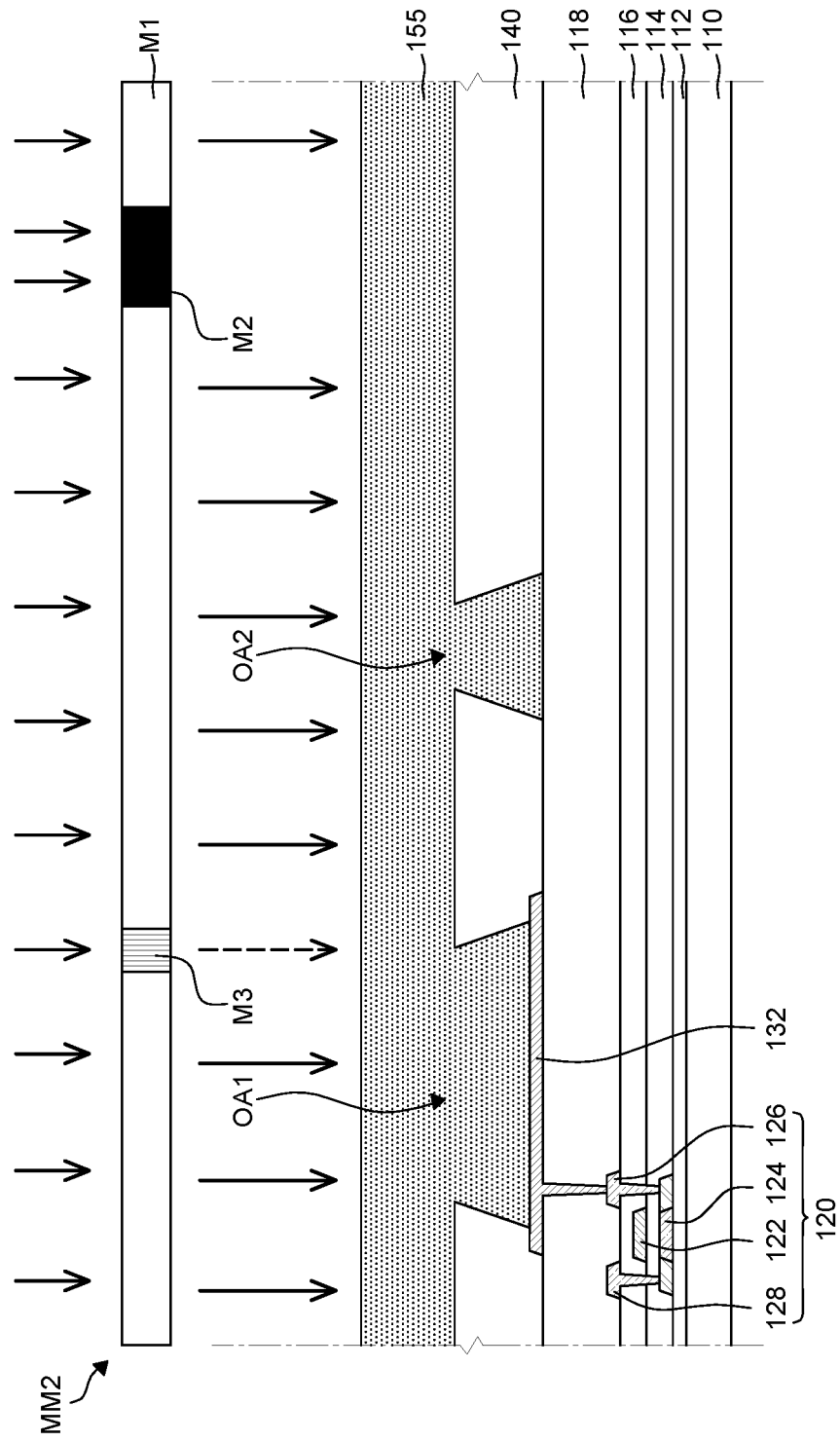

Next, referring to FIG. 8D, the second photoresist layer 155 is formed on the bank layer 140 including the first opening unit OA1 and the second opening unit OA2. The second photoresist layer 155 is formed of a positive photoresist. The positive photoresist is a photoresist whose solubility of the exposed portion in the developer is increased by the exposure. When the positive photoresist is developed, a pattern from which exposed portions are removed is obtained.

The second photoresist layer 155 may be applied and sintered to have a predetermined thickness to fill both the first opening unit OA1 and the second opening unit OA2 and planarize the bank layer 140.

Next, after disposing a second mask MM2 on the second photoresist layer 155, an exposure process which is a photolithographic process is performed. At this time, the second mask MM2 is a halftone mask and is configured by masks having different light transmissive amounts. That is, the second mask MM2 is configured by a transmissive area M1, a blocking area M2, and a semi-transmissive area M3. The second photoresist layer 155 corresponding to the transmissive area M1 is removed by a subsequent development process and a second photoresist layer 155 corresponding to the blocking area M2 forms a first spacer layer 150 by means of a subsequent development process. Further, the second photoresist layer 155 corresponding to the semi-transmissive area M3 forms a second spacer layer 160 by means of a subsequent development process. Therefore, the semi-transmissive area M3 of the second mask MM2 is disposed to overlap a part of an edge of the first opening unit OA1 of the bank layer 140.

Figure 8E:
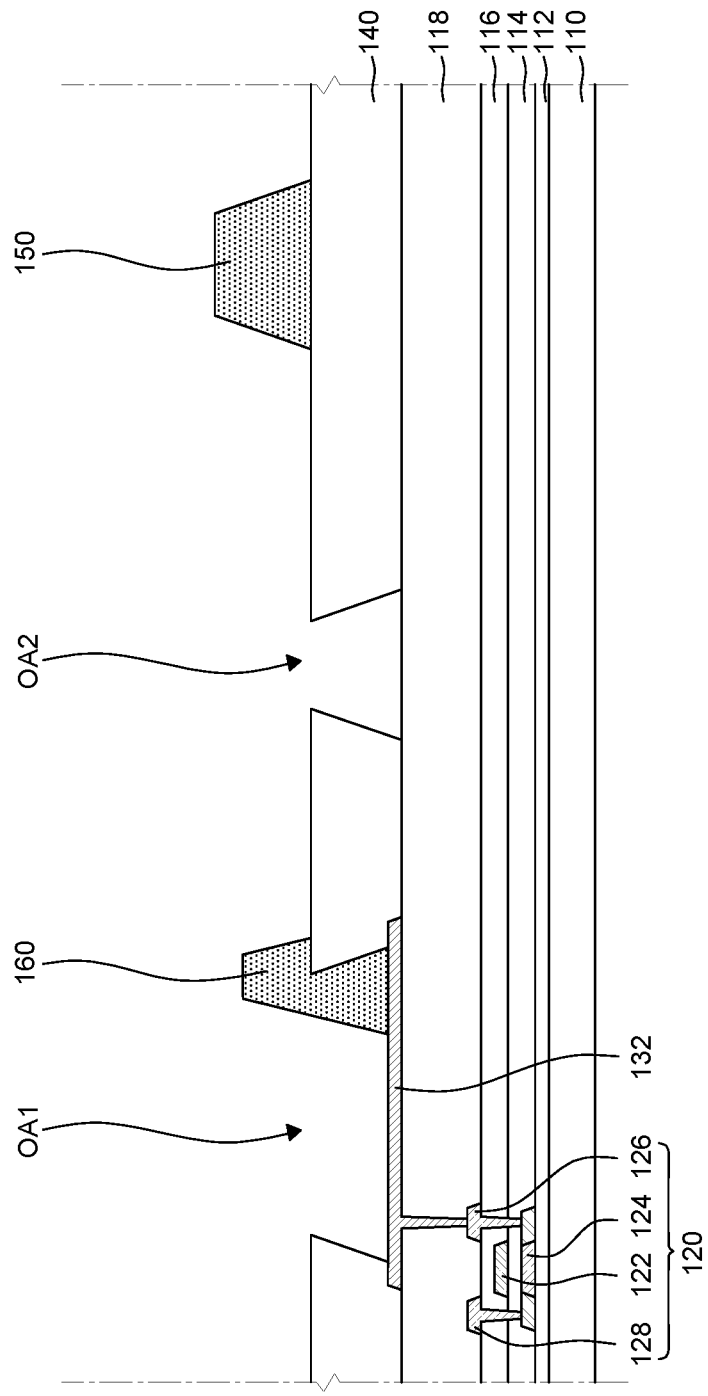

Next, referring to FIG. 8E, the second photoresist layer 155 which has undergone the exposure process is reacted with a developer to remove the second photoresist layer 155 of an exposed area. Next, a baking process which is a heating process is performed so that the second photoresist layer 155 corresponding to the transmissive area M1 reacts with the developer to be removed in the exposure process. The second photoresist layer 155 corresponding to the blocking area M2 does not react with the developer to form the first spacer 150 having a tapered shape and the second photoresist layer 155 corresponding to the semi-transmissive area M3 forms a second spacer 160 having a tapered shape. As described above, the first spacer 150 and the second spacer 160 may be simultaneously formed using the same photoresist by means of the photolithographic process. Even though not illustrated in FIG. 8E, the third spacer may be formed together with the second spacer 160 which overlaps a part of an edge of the third opening unit by means of the semi-transmissive area M3 of the second mask MM2.

Figure 8F:
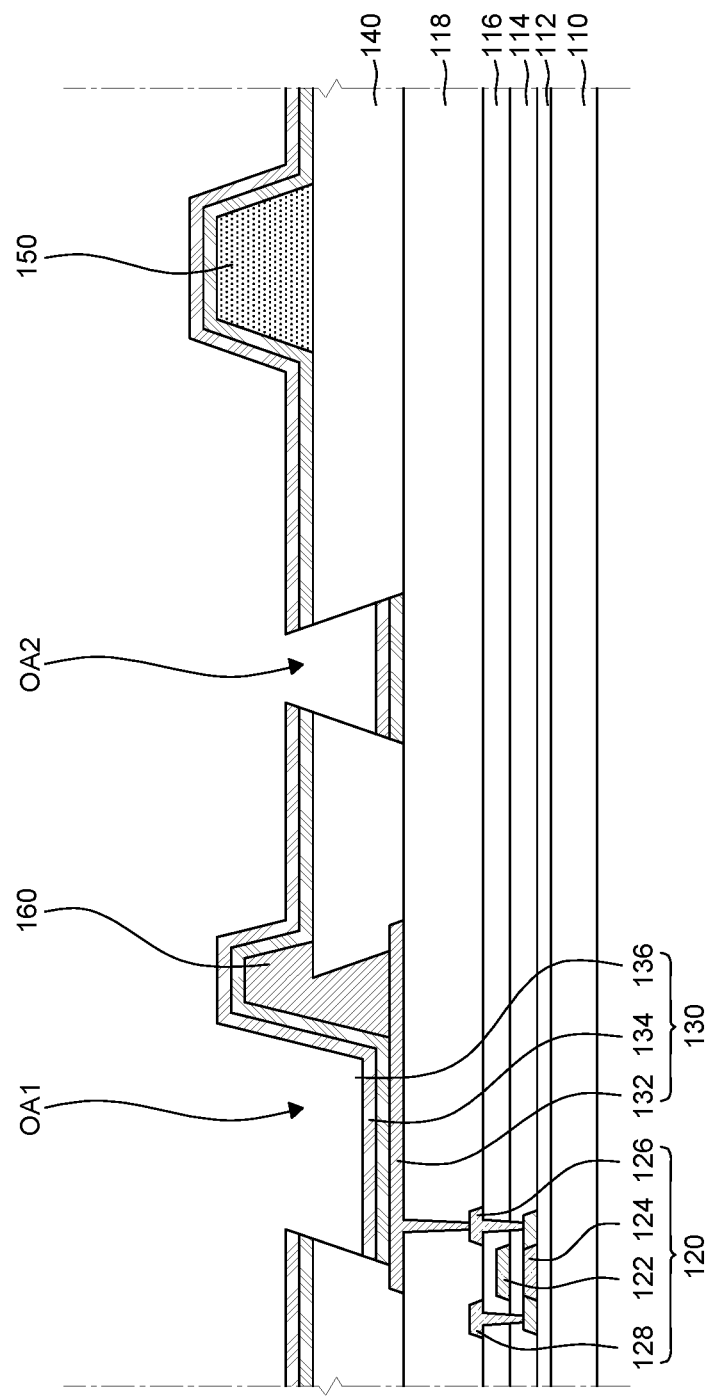

Next, referring to FIG. 8F, the organic light emitting layer 134 and the cathode 136 are formed on the bank layer 140 including the first opening unit OA1, the second opening unit OA2, and the third opening unit OA3, the first spacer 150, the second spacer 160, and the third spacer 160'. The organic light emitting layer 134 and the cathode 136 are disconnected by the bank layer 140 having a reverse tapered shape exposed by the first opening unit OA1 and the second opening unit OA2. However, the organic light emitting layer 134 and the cathode 136 may be continuously disposed to the top surface of the bank layer 140 along the side surface and the top surface of the second spacer 160 having a tapered shape which overlaps an edge of the first opening unit OA1. Next, a first inorganic encapsulation layer 172 of the encapsulation layer 170 is formed to be bonded to the exposed side surface of the bank layer 140 and fix the organic light emitting layer 134 and the cathode 136.

The exemplary aspects of the present disclosure can also be described as follows:

According to an aspect of the present disclosure, there is provided an organic light emitting display device. The organic light emitting display device comprises a substrate including a display area including a plurality of sub pixels and a non-display area which encloses the display area, a thin film transistor on the substrate, a planarization layer on the thin film transistor, an anode which is disposed on the planarization layer and is disposed for each sub pixel, a bank layer which is disposed on the planarization layer and includes a first opening unit exposing at least a part of the anode and a second opening unit spaced apart from the first opening unit, a first spacer on the bank layer, and a second spacer which is continuously disposed on the anode and the bank layer so as to overlap a part of an edge of the first opening unit. The bank layer has a reverse tapered shape and the second spacer has a tapered shape.

The second spacer may be in contact with a part of a top surface of the anode and be in contact with a side surface of the bank layer located in the first opening unit.

The first spacer may have the tapered shape.

The first spacer and the second spacer may be configured by the same material.

The bank layer may be formed with a negative photoresist and the first spacer and the second spacer may be formed with a positive photoresist.

A difference between a height of a top surface of the first spacer and a height of a top surface of the second spacer may be 1.0 μm to 3.0 μm.

The organic light emitting display device may further comprise an organic light emitting layer and a cathode disposed on the anode. The organic light emitting layer and the cathode may be in contact with a side surface of the bank layer so that continuity is broken and are continuously disposed along a top surface of the anode, a side surface and a top surface of the second spacer, and a top surface of the bank layer.

The organic light emitting display device may further comprise an encapsulation layer disposed on the bank layer, the first spacer, and the second spacer. The encapsulation layer may include a first inorganic encapsulation layer, an organic encapsulation layer, and a second inorganic encapsulation layer and the first inorganic encapsulation layer may be in contact with an exposed side surface of the bank layer and may be disposed to cover side surfaces and top surfaces of the first spacer and the second spacer.

The second opening unit may be spaced apart from the first spacer and the second spacer and may be disposed between the sub pixels.

The first opening unit may further include a groove extending from one edge in a first direction, and the second spacer is disposed so as to overlap a part of the groove.

All the grooves of the first opening unit corresponding to each sub pixel may be formed to extend in the same direction.

A plurality of second opening units may be provided so as to correspond to the sub pixels and each of the second opening units may be spaced apart from the groove of the first opening unit to enclose the groove.

A plurality of second opening units may be provided so as to correspond to the sub pixels and each of the second opening units may be spaced apart from the groove of the first opening unit and have a bending portion disposed so as to be opposite the groove.

The bank layer located in the non-display area may further include a third opening unit which exposes at least a part of a connection electrode connected to a signal line, and the organic light emitting display device may further comprise a third spacer which is continuously disposed on the connection electrode and the bank layer so as to overlap a part of an edge of the third opening unit.

A side surface of the bank layer of the third opening unit may have the reverse tapered shape and the third spacer may have the tapered shape.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a substrate including a display area having a plurality of sub pixels and a non-display area which encloses the display area;
   a thin film transistor disposed on the substrate;
   a planarization layer disposed on the thin film transistor;
   an anode disposed on the planarization layer and disposed in each sub pixel;
   a bank layer disposed on the planarization layer and including a first opening unit exposing at least a part of the anode and a second opening unit spaced apart from the first opening unit;
   a first spacer disposed on the bank layer; and
   a second spacer continuously disposed on the anode and the bank layer to overlap with a part of an edge of the first opening unit,
   wherein the second spacer has a tapered shape,
   wherein the bank layer is black bank including a black pigment, and
   wherein a part of the second spacer is located in the first opening unit and the second spacer covers a part of a side surface of the bank layer exposed by the first opening unit.

2. The organic light emitting display device according to claim 1, wherein the second spacer is in contact with a part of a top surface of the anode and is in contact with a side surface of the bank layer located in the first opening unit.

3. The organic light emitting display device according to claim 1, wherein the first spacer has a tapered shape.

4. The organic light emitting display device according to claim 3, wherein the first spacer and the second spacer are formed of a same material.

5. The organic light emitting display device according to claim 1, wherein the bank layer is formed with a negative photoresist and the first spacer and the second spacer are formed with a positive photoresist.

6. The organic light emitting display device according to claim 1, wherein a difference between a height of a top surface of the first spacer and a height of a top surface of the second spacer is between 1.0 μm and 3.0 μm.

7. The organic light emitting display device according to claim 1, further comprising an organic light emitting layer and a cathode disposed on the anode.

8. The organic light emitting display device according to claim 7, wherein the organic light emitting layer and the cathode are in contact with a side surface of the bank layer so that continuity is broken and are continuously disposed along a top surface of the anode, a side surface and a top surface of the second spacer and a top surface of the bank layer.

9. The organic light emitting display device according to claim 7, further comprising an encapsulation layer disposed on the bank layer, the first spacer, and the second spacer.

10. The organic light emitting display device according to claim 9, wherein the encapsulation layer includes a first inorganic encapsulation layer, an organic encapsulation layer, and a second inorganic encapsulation layer.

11. The organic light emitting display device according to claim 10, wherein the first inorganic encapsulation layer is in contact with an exposed side surface of the bank layer and is disposed to cover side surfaces and top surfaces of the first spacer and the second spacer.

12. The organic light emitting display device according to claim 1, wherein the second opening unit is spaced apart from the first spacer and the second spacer and is disposed between the sub pixels.

13. The organic light emitting display device according to claim 1, wherein the first opening unit further includes a groove extended from one edge in a first direction, and the second spacer is disposed so as to overlap with a part of the groove.

14. The organic light emitting display device according to claim 13, wherein each of the groove of the first opening unit corresponding to each sub pixel is formed to extend in a same direction.

15. The organic light emitting display device according to claim 13, wherein each of the second opening unit is provided to correspond to each sub pixel and each of the second opening unit is spaced apart from the groove of the first opening unit to enclose the groove.

16. The organic light emitting display device according to claim 13, wherein each of second opening unit is provided to correspond to each of the sub pixels and each of the second opening units is spaced apart from the groove of the first opening unit and has a bending portion disposed to be opposite the groove.

17. The organic light emitting display device according to claim 1, further comprising a third opening unit disposed in the bank layer located in the non-display area,
wherein the third opening unit exposes at least a part of a connection electrode connected to a signal line.

18. The organic light emitting display device according to claim 17, further comprising a third spacer continuously disposed on the connection electrode and the bank layer to overlap with a part of an edge of the third opening unit.

19. The organic light emitting display device according to claim 18, wherein a side surface of the bank layer of the third opening unit has a reverse tapered shape and the third spacer has a tapered shape.

20. The organic light emitting display device according to claim 1, wherein the bank layer has a reverse tapered shape.

* * * * *